United States Patent
Lung et al.

(10) Patent No.: US 8,030,635 B2
(45) Date of Patent: Oct. 4, 2011

(54) POLYSILICON PLUG BIPOLAR TRANSISTOR FOR PHASE CHANGE MEMORY

(75) Inventors: Hsiang-Lan Lung, Dobbs Ferry, NY (US); Erh-Kun Lai, Elmsford, NY (US); Bipin Rajendran, White Plains, NY (US); Chung Hon Lam, Peekskill, NY (US)

(73) Assignees: Macronix International Co., Ltd., Hsinchu (TW); International Business Machines Corporation, Armonk, NY (US)

( * ) Notice: Subject to any disclaimer, the term of this patent is extended or adjusted under 35 U.S.C. 154(b) by 102 days.

(21) Appl. No.: 12/353,219

(22) Filed: Jan. 13, 2009

(65) Prior Publication Data

US 2010/0176362 A1 Jul. 15, 2010

(51) Int. Cl.
*H01L 29/02* (2006.01)
(52) U.S. Cl. ......... 257/2; 257/3; 257/4; 257/5; 257/565; 257/309; 257/E29.002; 257/E47.001; 257/E29.174; 257/E21.613; 438/102; 438/103; 365/163
(58) Field of Classification Search .................. 257/1–5, 257/E29.002, 565, 309, E47.001, E29.174, 257/E21.613; 438/102–103; 365/163
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,391,901 A | 2/1995 | Tanabe et al. | |
| 5,515,488 A | 5/1996 | Hoppe et al. | |
| 5,534,712 A | 7/1996 | Ovshinsky et al. | |
| 5,550,396 A | 8/1996 | Tsutsumi et al. | |
| 5,687,112 A | 11/1997 | Ovshinsky | |
| 5,688,713 A | 11/1997 | Linliu et al. | |
| 5,716,883 A | 2/1998 | Tseng et al. | |
| 5,754,472 A | 5/1998 | Sim et al. | |
| 5,789,277 A | 8/1998 | Zahorik et al. | |

(Continued)

OTHER PUBLICATIONS

"Magnetic Bit Boost," www.sciencenews.org, Dec. 18 & 25, 2004, p. 389, vol. 166.

(Continued)

*Primary Examiner* — Jami M Valentine
(74) *Attorney, Agent, or Firm* — Haynes Beffel & Wolfeld LLP

(57) ABSTRACT

Memory devices and methods for manufacturing are described herein. A memory device described herein includes a plurality of memory cells. Memory cells in the plurality of memory cells comprise respective bipolar junction transistors and memory elements. The bipolar junction transistors are arranged in a common collector configuration and include an emitter comprising doped polysilicon having a first conductivity type, the emitter contacting a corresponding word line in a plurality of word lines to define a pn junction. The bipolar junction transistors include a portion of the corresponding word line underlying the emitter acting as a base, and a collector comprising a portion of the single-crystalline substrate underlying the base.

20 Claims, 49 Drawing Sheets

U.S. PATENT DOCUMENTS

| | | |
|---|---|---|
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan et al. |
| 6,025,220 A | 2/2000 | Sandhu |
| 6,031,287 A | 2/2000 | Harshfield |
| 6,034,882 A | 3/2000 | Johnson et al. |
| 6,046,951 A | 4/2000 | El Hajji et al. |
| 6,066,870 A | 5/2000 | Siek |
| 6,075,719 A | 6/2000 | Lowrey et al. |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,229,157 B1 | 5/2001 | Sandhu |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,337,266 B1 | 1/2002 | Zahorik |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,392,913 B1 | 5/2002 | Sandhu |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,106 B1 | 11/2002 | Kozicki |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,512,263 B1 | 1/2003 | Yuan et al. |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung et al. |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,677,678 B2 | 1/2004 | Biolsi et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,504 B2 | 10/2004 | Li et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung et al. |
| 6,867,638 B2 | 3/2005 | Saiki et al. |
| 6,881,603 B2 | 4/2005 | Lai |
| 6,888,750 B2 | 5/2005 | Walker et al. |
| 6,894,304 B2 | 5/2005 | Moore |
| 6,894,305 B2 | 5/2005 | Yi et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen et al. |
| 7,005,665 B2 | 2/2006 | Furkay et al. |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,054,183 B2 | 5/2006 | Rinerson et al. |
| 7,067,837 B2 | 6/2006 | Hwang et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,099,180 B1 | 8/2006 | Dodge et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,126,847 B2 | 10/2006 | Ha et al. |
| 7,132,675 B2 | 11/2006 | Gilton |
| 7,151,273 B2 | 12/2006 | Campbell et al. |
| 7,154,774 B2 | 12/2006 | Bedeschi et al. |
| 7,158,411 B2 | 1/2007 | Yeh et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,229,883 B2 | 6/2007 | Wang et al. |

| | | | | | |
|---|---|---|---|---|---|
| 7,238,959 B2 | 7/2007 | Chen | 2006/0126395 A1 | 6/2006 | Chen et al. |
| 7,238,994 B2 | 7/2007 | Chen et al. | 2006/0131555 A1 | 6/2006 | Liu et al. |
| 7,248,494 B2 | 7/2007 | Oh et al. | 2006/0138467 A1 | 6/2006 | Lung |
| 7,251,157 B2 | 7/2007 | Osada et al. | 2006/0154185 A1 | 7/2006 | Ho et al. |
| 7,253,429 B2 | 8/2007 | Klersy et al. | 2006/0157681 A1 | 7/2006 | Chen et al. |
| 7,254,059 B2 | 8/2007 | Li et al. | 2006/0163554 A1 | 7/2006 | Lankhorst et al. |
| 7,269,052 B2 | 9/2007 | Segal et al. | 2006/0172067 A1 | 8/2006 | Ovshinsky et al. |
| 7,277,317 B2 | 10/2007 | Le Phan et al. | 2006/0175599 A1 | 8/2006 | Happ |
| 7,291,556 B2 | 11/2007 | Choi et al. | 2006/0186483 A1 | 8/2006 | Cho et al. |
| 7,309,630 B2 | 12/2007 | Fan et al. | 2006/0198183 A1 | 9/2006 | Kawahara et al. |
| 7,321,130 B2 | 1/2008 | Lung et al. | 2006/0205108 A1 | 9/2006 | Maimon et al. |
| 7,323,708 B2 | 1/2008 | Lee et al. | 2006/0211165 A1 | 9/2006 | Hwang et al. |
| 7,323,734 B2 | 1/2008 | Ha et al. | 2006/0226409 A1 | 10/2006 | Burr et al. |
| 7,332,370 B2 | 2/2008 | Chang et al. | 2006/0234138 A1 | 10/2006 | Fehlhaber et al. |
| 7,336,526 B2 | 2/2008 | Osada et al. | 2006/0237756 A1 | 10/2006 | Park et al. |
| 7,351,648 B2 | 4/2008 | Furukawa et al. | 2006/0245236 A1 | 11/2006 | Zaidi |
| 7,359,231 B2 | 4/2008 | Venkataraman et al. | 2006/0250885 A1 | 11/2006 | Cho et al. |
| 7,364,935 B2 | 4/2008 | Lung et al. | 2006/0261380 A1 | 11/2006 | Reinberg et al. |
| 7,365,385 B2 | 4/2008 | Abbott | 2006/0261392 A1 | 11/2006 | Lee et al. |
| 7,379,328 B2 | 5/2008 | Osada et al. | 2006/0266993 A1 | 11/2006 | Suh et al. |
| 7,385,235 B2 | 6/2008 | Lung et al. | 2006/0284157 A1 | 12/2006 | Chen et al. |
| 7,388,273 B2 | 6/2008 | Burr et al. | 2006/0284158 A1 | 12/2006 | Lung et al. |
| 7,394,088 B2 | 7/2008 | Lung | 2006/0284214 A1 | 12/2006 | Chen |
| 7,397,060 B2 | 7/2008 | Lung | 2006/0284279 A1 | 12/2006 | Lung et al. |
| 7,400,522 B2 | 7/2008 | Toda et al. | 2006/0286709 A1 | 12/2006 | Lung et al. |
| 7,423,300 B2 | 9/2008 | Lung et al. | 2006/0286743 A1 | 12/2006 | Lung et al. |
| 7,426,134 B2 | 9/2008 | Happ et al. | 2006/0289847 A1 | 12/2006 | Dodge |
| 7,440,308 B2 | 10/2008 | Jeong et al. | 2006/0289848 A1 | 12/2006 | Dennison |
| 7,449,710 B2 | 11/2008 | Lung | 2007/0007613 A1 | 1/2007 | Wang et al. |
| 7,473,576 B2 | 1/2009 | Lung | 2007/0008786 A1 | 1/2007 | Scheuerlein |
| 7,479,649 B2 | 1/2009 | Lung | 2007/0030721 A1 | 2/2007 | Segal et al. |
| 7,485,891 B2 | 2/2009 | Hamann et al. | 2007/0037101 A1 | 2/2007 | Morioka |
| 7,502,252 B2 | 3/2009 | Fuji et al. | 2007/0040159 A1 | 2/2007 | Wang |
| 7,507,986 B2 | 3/2009 | Lung | 2007/0096162 A1 | 5/2007 | Happ et al. |
| 7,514,334 B2 | 4/2009 | Chen et al. | 2007/0096248 A1 | 5/2007 | Philipp et al. |
| 7,514,705 B2 | 4/2009 | Breitwisch et al. | 2007/0103963 A1 | 5/2007 | Kim et al. |
| 7,515,461 B2 | 4/2009 | Happ et al. | 2007/0108077 A1 | 5/2007 | Lung et al. |
| 2002/0070457 A1 | 6/2002 | Sun et al. | 2007/0108429 A1 | 5/2007 | Lung |
| 2002/0113273 A1 | 8/2002 | Hwang et al. | 2007/0108430 A1 | 5/2007 | Lung |
| 2003/0072195 A1 | 4/2003 | Mikolajick | 2007/0108431 A1 | 5/2007 | Chen et al. |
| 2003/0095426 A1 | 5/2003 | Hush et al. | 2007/0109836 A1 | 5/2007 | Lung |
| 2003/0186481 A1 | 10/2003 | Lung | 2007/0109843 A1 | 5/2007 | Lung et al. |
| 2004/0026686 A1 | 2/2004 | Lung | 2007/0111429 A1 | 5/2007 | Lung |
| 2004/0051094 A1 | 3/2004 | Ooishi | 2007/0115794 A1 | 5/2007 | Lung |
| 2004/0113137 A1 | 6/2004 | Lowrey | 2007/0117315 A1 | 5/2007 | Lai et al. |
| 2004/0165422 A1 | 8/2004 | Hideki et al. | 2007/0120104 A1 | 5/2007 | Ahn et al. |
| 2004/0248339 A1 | 12/2004 | Lung | 2007/0121363 A1 | 5/2007 | Lung |
| 2004/0256610 A1 | 12/2004 | Lung | 2007/0121374 A1 | 5/2007 | Lung et al. |
| 2005/0018526 A1 | 1/2005 | Lee | 2007/0126040 A1 | 6/2007 | Lung |
| 2005/0029502 A1 | 2/2005 | Hudgens | 2007/0131922 A1 | 6/2007 | Lung |
| 2005/0029587 A1 | 2/2005 | Harshfield | 2007/0138458 A1 | 6/2007 | Lung |
| 2005/0052904 A1 | 3/2005 | Cho et al. | 2007/0147105 A1 | 6/2007 | Lung et al. |
| 2005/0062087 A1 | 3/2005 | Chen et al. | 2007/0153563 A1 | 7/2007 | Nirschl |
| 2005/0093022 A1 | 5/2005 | Lung | 2007/0154847 A1 | 7/2007 | Chen et al. |
| 2005/0127349 A1 | 6/2005 | Horak et al. | 2007/0155172 A1 | 7/2007 | Lai et al. |
| 2005/0141261 A1 | 6/2005 | Ahn | 2007/0156949 A1 | 7/2007 | Rudelic et al. |
| 2005/0145984 A1 | 7/2005 | Chen et al. | 2007/0158632 A1 | 7/2007 | Ho |
| 2005/0167656 A1 | 8/2005 | Sun et al. | 2007/0158633 A1 | 7/2007 | Lai et al. |
| 2005/0191804 A1 | 9/2005 | Lai et al. | 2007/0158645 A1 | 7/2007 | Lung |
| 2005/0195633 A1 | 9/2005 | Choi et al. | 2007/0158690 A1 | 7/2007 | Ho et al. |
| 2005/0201182 A1 | 9/2005 | Osada et al. | 2007/0158862 A1 | 7/2007 | Lung |
| 2005/0212024 A1 | 9/2005 | Happ | 2007/0161186 A1 | 7/2007 | Ho |
| 2005/0212026 A1 | 9/2005 | Chung et al. | 2007/0170881 A1 | 7/2007 | Noh et al. |
| 2005/0215009 A1 | 9/2005 | Cho | 2007/0173019 A1 | 7/2007 | Ho et al. |
| 2005/0263829 A1 | 12/2005 | Song et al. | 2007/0173063 A1 | 7/2007 | Lung |
| 2005/0270832 A1 | 12/2005 | Chu et al. | 2007/0176261 A1 | 8/2007 | Lung |
| 2006/0006472 A1 | 1/2006 | Jiang | 2007/0187664 A1 | 8/2007 | Happ |
| 2006/0038221 A1 | 2/2006 | Lee et al. | 2007/0201267 A1 | 8/2007 | Happ et al. |
| 2006/0066156 A1 | 3/2006 | Dong et al. | 2007/0215852 A1 | 9/2007 | Lung |
| 2006/0073642 A1 | 4/2006 | Yeh et al. | 2007/0224726 A1 | 9/2007 | Chen et al. |
| 2006/0091476 A1 | 5/2006 | Pinnow et al. | 2007/0235811 A1 | 10/2007 | Furukawa et al. |
| 2006/0094154 A1 | 5/2006 | Lung | 2007/0236989 A1 | 10/2007 | Lung |
| 2006/0108667 A1 | 5/2006 | Lung | 2007/0246699 A1 | 10/2007 | Lung |
| 2006/0110878 A1 | 5/2006 | Lung et al. | 2007/0249090 A1 | 10/2007 | Philipp et al. |
| 2006/0110888 A1 | 5/2006 | Cho et al. | 2007/0257300 A1 | 11/2007 | Ho et al. |
| 2006/0113520 A1 | 6/2006 | Yamamoto et al. | 2007/0262388 A1 | 11/2007 | Ho et al. |
| 2006/0113521 A1 | 6/2006 | Lung | 2007/0267618 A1 | 11/2007 | Zaidi et al. |
| 2006/0118913 A1 | 6/2006 | Yi et al. | 2007/0274121 A1 | 11/2007 | Lung et al. |
| 2006/0124916 A1 | 6/2006 | Lung | 2007/0285960 A1 | 12/2007 | Lung et al. |

| | | |
|---|---|---|
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0138929 A1 | 6/2008 | Lung |
| 2008/0138930 A1 | 6/2008 | Lung |
| 2008/0138931 A1 | 6/2008 | Lung |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0197334 A1 | 8/2008 | Lung |
| 2008/0224119 A1 | 9/2008 | Burr et al. |
| 2008/0225489 A1 | 9/2008 | Cai et al. |
| 2008/0265234 A1 | 10/2008 | Breitwisch et al. |
| 2008/0311722 A1* | 12/2008 | Petti et al. ............... 438/378 |
| 2009/0001341 A1 | 1/2009 | Breitwisch et al. |
| 2009/0014704 A1 | 1/2009 | Chen et al. |
| 2009/0023242 A1 | 1/2009 | Lung |
| 2009/0027950 A1 | 1/2009 | Lam et al. |
| 2009/0042335 A1 | 2/2009 | Lung |
| 2009/0057641 A1 | 3/2009 | Lung |
| 2009/0098678 A1 | 4/2009 | Lung |
| 2009/0166600 A1 | 7/2009 | Park et al. |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gilbert, Nad E., "A macro model of programmable metallization cell devices," Solid-State Electronics 49 (2005) 1813-1819.

Gill, Manzur et al., "A High-Performance Nonvolatile Memory Technology for Stand-Alone Memory and Embedded Applications," 2002 IEEE-ISSCC Technical Digest (TD 12.4), 7 pp.

Gleixner, "Phase Change Memory Reliability", 22nd NVSMW, Aug. 26, 2007, 46 pages.

Ha, Y. H. et al., "An Edge Contact Type Cell for Phase Change RAM Featuring Very Low Power Consumption," 2003 Symposium on VLSI Technology Digest of Technical Papers, pp. 175-176.

Hanzawa, Satoru, et al., "A 512kB Embedded Phase Change Memory with 416kB/s Write Throughput at 100μA Cell Write Current," ISSCC 2007, Session 26, Non-Volatile Memories/26.2, 3 pages.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Oh, Hyung-Rok, et al., "Enhanced Write Performance of a 64Mb Phase-Change Random Access Memory," ISSCC 2005, Session 2, Non-Volatile Memory, 2.3, 3 pages.

Oh, J.H., et al., "Full Integration of Highly Manufacturable 512Mb PRAM based on 90nm Technology," Electron Devices Meeting, 2006. IEDM '06. International Dec. 11-13, 2006 pp. 1-4.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase—Change Memory Cell for Embedded and Stand-Alone Non-Volatile Memory Applications," 2004 Symposium on VLSI Technology Digest of Technical Papers, pp. 18-19.

Pellizer, F., et al., "A 90nm Phase Change Memory Technology for Stand-Alone Non-Volatile Memory Applications," STM/Intel VLSI 2006, 2 pages.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yamada, Noboru, "Potential of Ge-Sb-Te phase-change optical disks for high-data-rate recording in the near future," (Conference Proceedings Paper), Jul. 30, 1997, vol. 3109, 10 pages.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

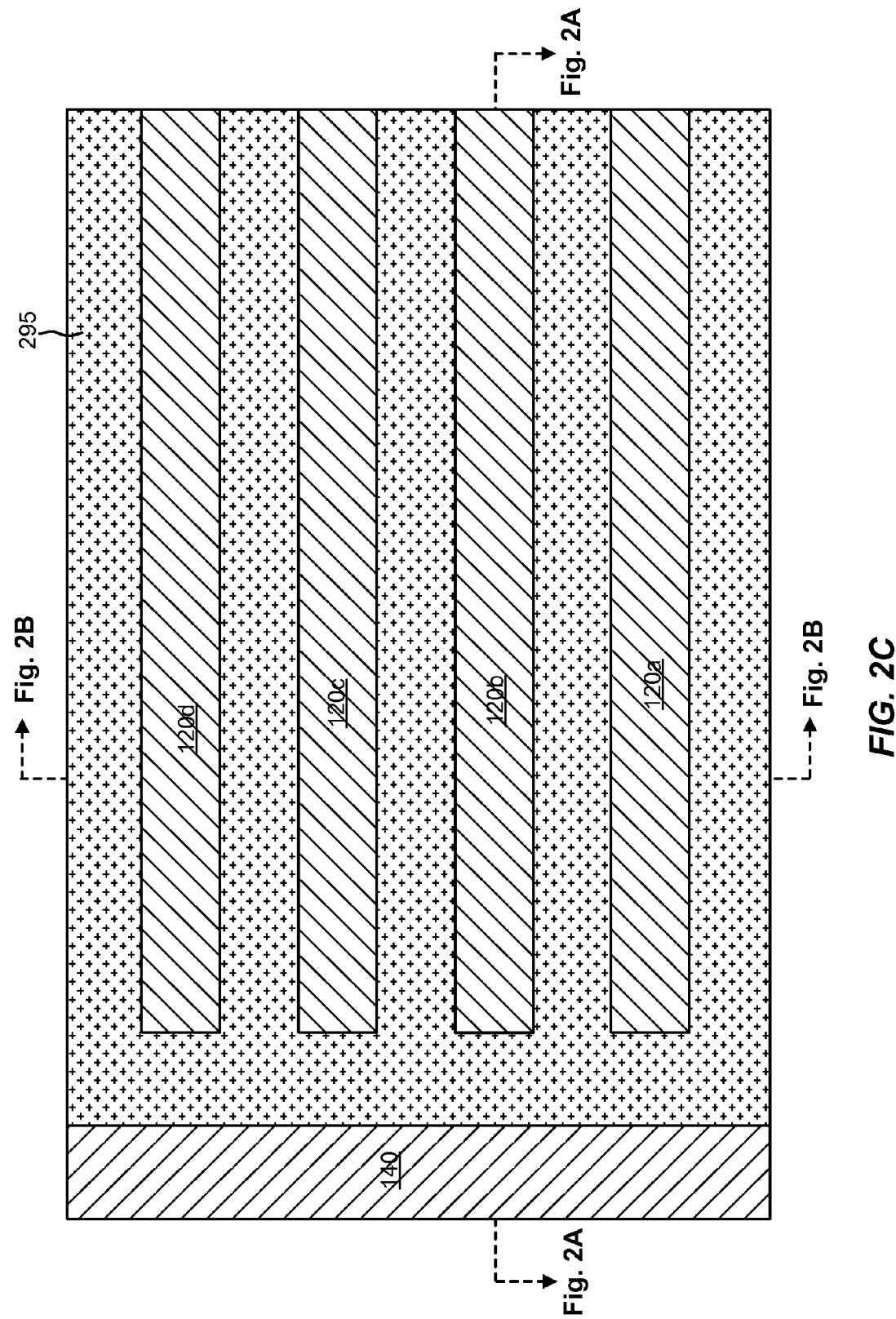

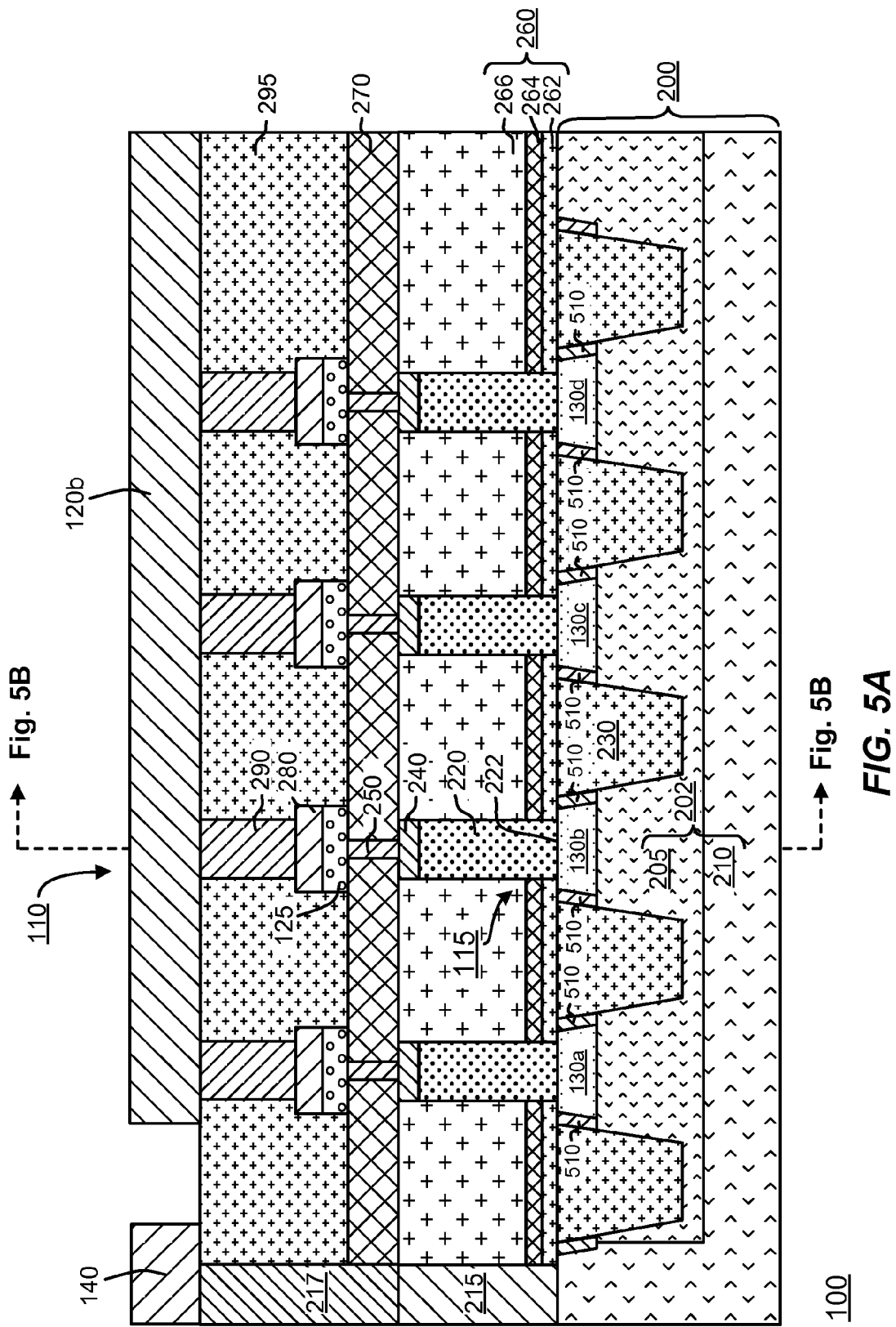

POLYSILICON PLUG BIPOLAR TRANSISTOR FOR PHASE CHANGE MEMORY

CROSS-REFERENCE TO RELATED APPLICATIONS

This application is related to co-pending U.S. patent application Ser. No. 12/357,912 entitled "Polysilicon Plug Bipolar Transistor with Self-Aligned Memory Element", filed on Jan. 22, 2009.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND OF THE INVENTION

1. Field of the Invention

The present invention relates to high density memory devices based on phase change based memory materials, including chalcogenide based materials and on other programmable resistive materials, and methods for manufacturing such devices.

2. Description of Related Art

Phase change based memory materials, like chalcogenide based materials and similar materials, can be caused to change phase between an amorphous state and a crystalline state by application of electrical current at levels suitable for implementation in integrated circuits. The generally amorphous state is characterized by higher electrical resistivity than the generally crystalline state, which can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the molten phase change material and allowing at least a portion of the phase change material to stabilize in the amorphous state.

Because the phase change occurs as a result of heating, a relatively large current is needed in order to heat the phase change material and induce the desired phase change. Issues have arisen in obtaining the necessary current for phase change memory cells having field effect transistor access devices due to the relatively low current drive of field effect transistors.

Bipolar junction transistors can provide larger current drive than field effect transistors, but the integration of bipolar junction transistors with CMOS peripheral circuitry is difficult and results in highly complex designs and manufacturing processes.

It is therefore desirable to provide phase change memory cells with bipolar junction transistor access devices compatible with CMOS peripheral circuitry while also addressing the complexity of design integration and manufacturing processes.

SUMMARY OF THE INVENTION

A memory device described herein includes a single-crystalline semiconductor substrate having a first conductivity type, and a plurality of word lines within the substrate. The plurality of word lines have a second conductivity type different from the first conductivity type. The device includes a plurality of memory cells. Memory cells in the plurality of memory cells comprise respective bipolar junction transistors and memory elements. The bipolar junction transistors include an emitter comprising doped polysilicon having the first conductivity type, the emitter contacting a corresponding word line in the plurality of word lines to define a pn junction. The bipolar junction transistors also include a portion of the corresponding word line underlying the emitter acting as a base of the bipolar junction transistor, and collector comprising a portion of the single-crystalline substrate underlying the base.

A method for manufacturing a memory device as described herein comprises forming a single-crystalline semiconductor substrate having a first conductivity type, and forming a plurality of dielectric trenches within the single-crystalline substrate. A plurality of word lines are formed within the single-crystalline substrate, the plurality of word lines having a second conductivity type different from the first conductivity type and adjacent word lines separated by a dielectric trench in the plurality of dielectric trenches. A plurality of doped polysilicon plugs having the first conductivity type are formed contacting the plurality of word lines. A plurality of memory elements are formed electrically coupled to the plurality of doped polysilicon plugs and top electrodes are formed on the memory elements. A plurality of bit lines overlying and electrically coupled to the top electrodes are then formed.

Memory devices described herein include phase change memory cells with bipolar junction transistor access devices compatible with CMOS peripheral circuitry while also addressing the complexity of design integration and manufacturing processes.

Other aspects and advantages of the present invention can be seen on review of the drawings, the detailed description, and the claims which follow.

BRIEF DESCRIPTION OF THE DRAWINGS

FIG. 2C illustrates a top view of the first embodiment of memory cells arranged in an array.

FIGS. 5A-5B illustrate cross-sectional views of a portion of a fourth embodiment of memory cells arranged in an array.

DETAILED DESCRIPTION

Figure 1:
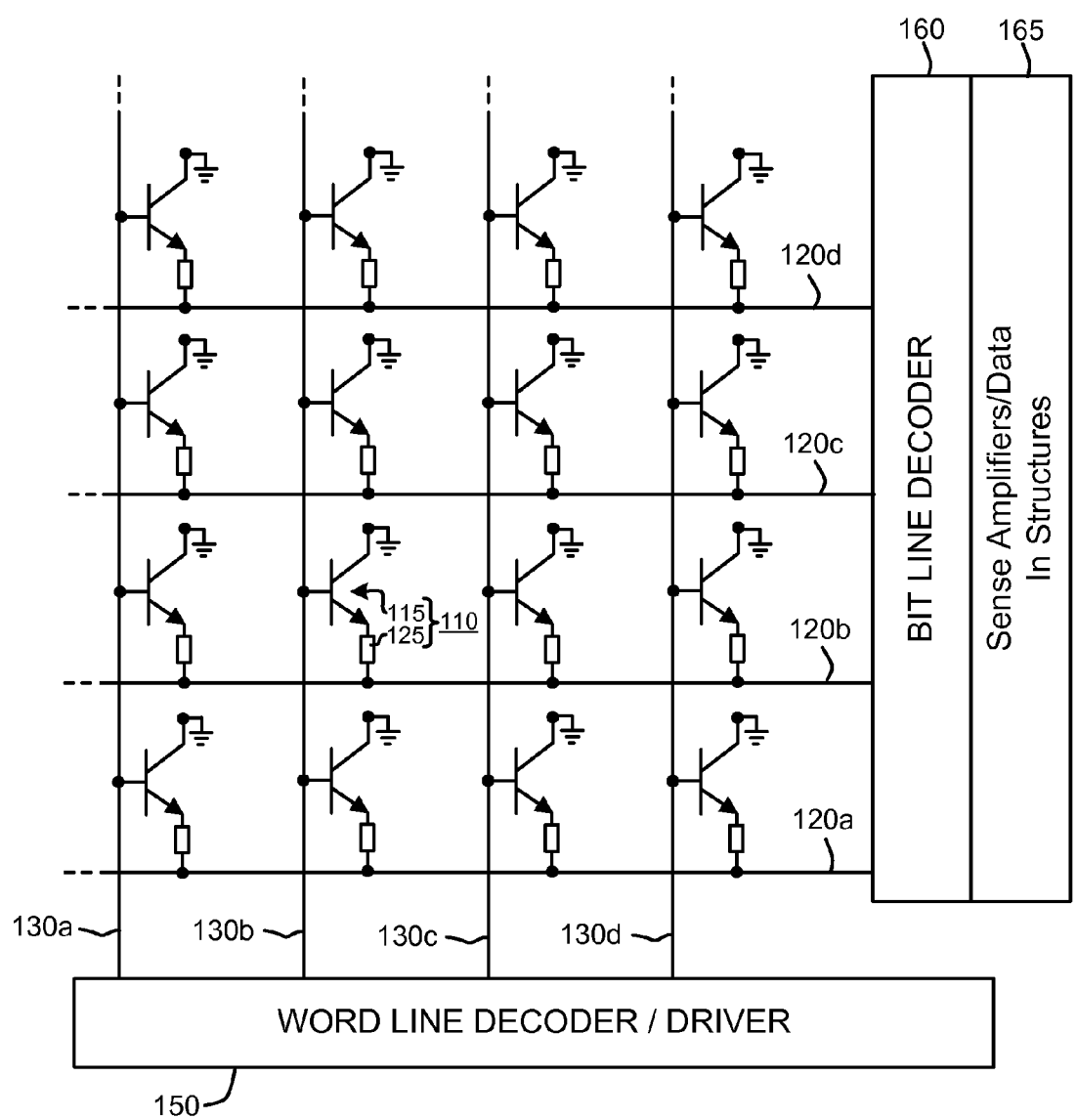
FIG. 1 illustrates a schematic diagram of a portion of a memory cell array implemented using memory cells having bipolar junction transistors with polysilicon emitters as described herein.

The following description of the disclosure will typically be with reference to specific structural embodiments and methods. It is to be understood that there is no intention to limit the disclosure to the specifically disclosed embodiments and methods, but that the disclosure may be practiced using other features, elements, methods and embodiments. Preferred embodiments are described to illustrate the present disclosure, not to limit its scope, which is defined by the claims. Those of ordinary skill in the art will recognize a variety of equivalent variations on the description that follows. Like elements in various embodiments are commonly referred to with like reference numerals.

FIG. 1 illustrates a schematic diagram of a portion of a memory cell array 100 implemented using memory cells having bipolar junction transistors with polysilicon emitters as described herein.

As shown in the schematic diagram of FIG. 1, each of the memory cells of array 100 includes a bipolar junction transistor access device and a memory element arranged in electrical series, the memory elements capable of being set to one of a plurality of resistive states and thus capable of storing one or more bits of data.

The array 100 comprises a plurality of word lines 130 including word lines 130a, 130b, 130c, 130d extending in parallel in a first direction and in electrical communication with word line decoder/driver 150. The word lines 130 are coupled to the base terminals of the bipolar access transistors of the array 100.

A plurality of bit lines 120 including bit lines 120a, 120b, 120c, 120d extend in parallel in a second direction and are in electrical communication with bit line decoder 160. The emitter terminals of the respective bipolar junction transistors are coupled to a corresponding bit line 120 via the memory elements.

The memory cells of the array 100 are coupled in a common collector configuration. In a common collector configuration, the collector terminals of the memory cells are coupled to a reference voltage, and the input and output are the base and emitter terminals respectively. Thus, in operation voltages on the bit lines 120 and word lines 130 induce a current to flow from the bit lines 120 to the collector terminals, or vice versa, through the emitter terminals and the memory elements.

In FIG. 1 the collector terminals are coupled to ground. Alternatively, the collector terminals may be coupled to a voltage source for applying a reference voltage other than ground. See, for example, Biasing Arrangement Supply Voltages, Current Sources 2536 of FIG. 25.

Memory cell 110 is representative of the memory cells of array 100 and comprises bipolar junction transistor 115 and phase change memory element 125 arranged in electrical series. The base terminal of the bipolar junction transistor 115 is coupled to the word line 130b, and the emitter terminal of the transistor 115 is coupled to the bit line 120b via the phase change memory element 125.

Reading or writing to memory cell 110 of array 100 can be achieved by applying appropriate voltages and/or currents to the corresponding word line 130b and the corresponding bit line 120b to induce a current through the selected memory cell 110. The level and duration of the voltages/currents applied is dependent upon the operation performed, e.g. a reading operation or a writing operation.

In a reset (erase) operation of the memory cell 110, a reset pulse applied to the word line 130b and the bit line 120b induces a current through the memory element 125 to cause a transition of an active region into an amorphous phase, thereby setting the phase change material to a resistance within a resistive value range associated with the reset state. The reset pulse is a relatively high energy pulse, sufficient to raise the temperature of at least the active region of the memory element 125 above the transition (crystallization) temperature of the phase change material and also above the melting temperature to place at least the active region in a liquid state. The reset pulse is then quickly terminated, resulting in a relatively quick quenching time as the active region quickly cools to below the transition temperature so that the active region stabilizes to a generally amorphous phase.

In a set (or program) operation of memory cell 110, a program pulse is applied to the word line 130b and the bit line 120b of suitable amplitude and duration to induce a current through the memory cell 110 sufficient to raise the temperature of a portion of the active region above the transition temperature and cause a transition of a portion of the active region from the amorphous phase into a crystalline phase, this transition lowering the resistance of the memory element 125 and setting the memory cell 110 to the desired state.

In a read (or sense) operation of the data value stored in the memory cell 110, a read pulse applied to the corresponding word line 130b and the corresponding bit line 120b of suitable amplitude and duration to induce current to flow that does not result in the memory element 125 undergoing a change in resistive state. The current through the memory cell 110 is dependent upon the resistance of the memory element 125 and thus the data value stored in the memory cell 110. Thus, the data state of the memory cell may be determined, for example, by comparison of the current on bit line 120b with a suitable reference current by sense amplifiers of block 165.

Figure 2A:
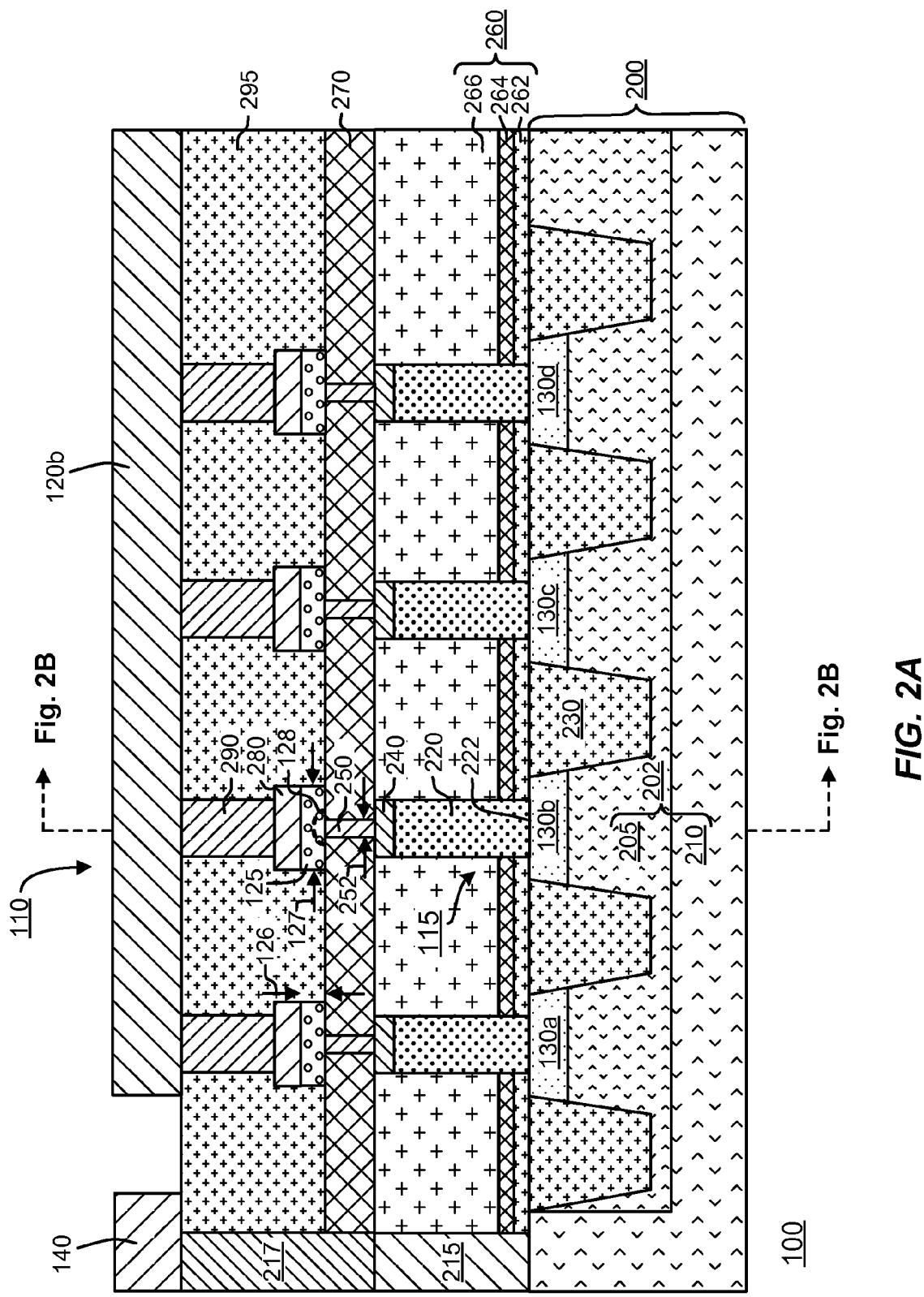
FIGS. 2A-2B illustrate cross-sectional views of a portion of a first embodiment of memory cells arranged in an array.
Figure 2B:
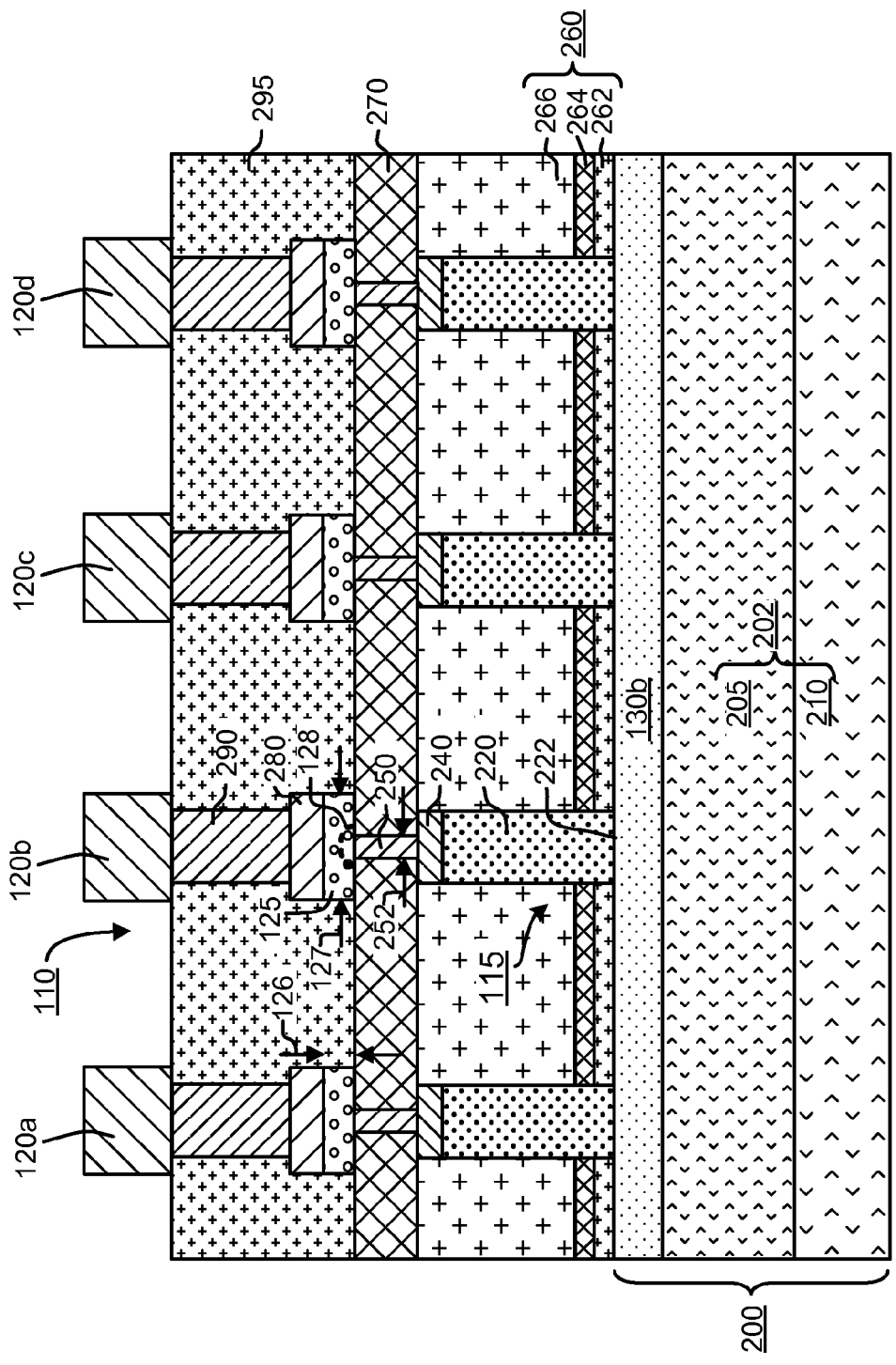

FIGS. 2A and 2B illustrate cross-sectional views of a portion of memory cells (including representative memory cell 110) arranged in the array 100 and FIG. 2C illustrates a top view of the array 100, FIG. 2A taken along the bit lines 120 and FIG. 2B taken along the word lines 130.

The array includes a substrate 200 comprising a well 202 having a first conductivity type, the well 202 comprising a first doped region 205 and a second doped region 210 more highly doped than the first doped region 205. The substrate 200 also includes word lines 130 within the well 202 and extending in a first direction into and out of the cross-section illustrated in FIG. 2A. The word lines 130 have a conductivity type different from the first conductivity type. The substrate 200, including first and second doped regions 205 and 210 and the word lines 130, comprise a single-crystalline semiconductor substrate.

The memory cell 110 includes a doped polysilicon plug 220 having the first conductivity type and acting as the emitter of the bipolar junction transistor 115, the doped polysilicon plug 220 contacting the corresponding word line 130b to define pn junction 222.

A portion of the word line 130b underlying the plug 220 acts as the base of the bipolar junction transistor 115. A portion of the well 202 underlying the word line 130b acts as a collector of the bipolar junction transistor 115.

The word lines 130 are separated by dielectric trenches 230 comprising dielectric material within the well 202. Conductive contacts 215, 217 couple the second doped region 210 of the well 202 to conductive material 140 coupled to a reference voltage.

In the illustrated embodiment the doped polysilicon plug 220 comprises highly doped N-type ($N^{++}$) polysilicon, the word lines 130 comprise regions of doped P-type material in silicon substrate 200, the first doped region 205 comprises regions of doped N-type material in silicon substrate 200, and the second doped region 210 comprises regions of highly doped N-type ($N^+$) material in silicon substrate 200, thus forming npn bipolar transistor 115.

In an alternative embodiment the doped polysilicon plug 220 comprises highly doped P-type (P$^{++}$) polysilicon, the word lines 130 comprise regions of doped N-type material in silicon substrate 200, the first doped region 205 comprises regions of doped P-type material in silicon substrate 200, and the second doped region 210 comprises regions of highly doped P-type (P$^+$) material in silicon substrate 200, thus forming pnp bipolar transistor 115.

The memory cell 110 includes a conductive cap 240 on the doped polysilicon plug 220. In the illustrated embodiment the conductive cap 240 comprises a silicide containing, for example, Ti, W, Co, Ni, or Ta. The conductive cap 240 provides a low resistance contact between the doped polysilicon plug 220 and bottom electrode 250. The doped polysilicon plug 220 and conductive cap 240 extend through dielectric 260. In the illustrated embodiment the dielectric 260 comprises a layer 262 of silicon dioxide, a layer 264 of silicon nitride on the layer 262, and a layer 266 of boro-phospho-silicate glass (BPSG) or PSG on the layer 264. In some embodiments the layer 264 may be omitted.

Bottom electrode 250 is on the conductive cap 240 and extends through dielectric 270 to contact a bottom surface of the memory element 125. The memory element 125 may comprise, for example, one or more materials from the group of Ge, Sb, Te, Se, In, Ti, Ga, Bi, Sn, Cu, Pd, Pb, Ag, S, Si, O, P, As, N and Au.

The bottom electrode 250 may comprise, for example, TiN or TaN. TiN may be preferred in embodiments in which memory element 125 comprises GST (discussed below) because it makes good contact with GST, it is a common material used in semiconductor manufacturing, and it provides a good diffusion barrier at the higher temperatures at which GST transitions, typically in the 600-700° C. range. Alternatively, the bottom electrode 250 may be TiAlN or TaAlN, or comprises, for further examples, one or more elements selected from the group consisting of Ti, W, Mo, Al, Ta, Cu, Pt, Ir, La, Ni, N, O, and Ru and combinations thereof.

A top electrode 280 is on the memory element 125, and a conductive contact 290 electrically couples the top electrode 280 to the bit line 120b. The top electrode 280 and the bit lines 120 may comprise, for example, any of the materials described above with reference to the bottom electrode 250.

Dielectric 295 surrounds the memory element 125, top electrode 280, and conductive contact 290. In the illustrated embodiment dielectric 270 comprises silicon nitride, and dielectric 295 comprises silicon dioxide.

In operation, voltages on the bit line 120b and word line 130b induces a current to flow from the bit line 120b to the substrate 200, or vice versa, through the emitter and the memory element 125.

The active region 128 is the region of the memory element 125 in which the memory material is induced to change between at least two solid phases. As can be appreciated, the active region 128 can be made extremely small in the illustrated structure, thus reducing the magnitude of the current needed to induce a phase change. The thickness 126 of the memory element 125 can be established using thin film deposition techniques. In some embodiments the thickness 126 is less than 100 nm, for example being between 10 and 100 nm. Furthermore, the memory element 125 has a width 127 greater than the width 252 of the bottom electrode 250. Additionally, the width 252 of the bottom electrode 250 is preferably less than a minimum feature size for a process, typically a lithographic process, used to form the array 100. The small bottom electrode 250 concentrates current density in the portion of the memory element 125 adjacent the bottom electrode 250, thereby reducing the magnitude of the current needed to induce a phase change in the active region 128. Additionally, the dielectric 270 may provide some additional thermal isolation to the active region 128, which also helps to reduce the amount of current necessary to induce a phase change.

As described above, bipolar junction transistors can provide larger current drive than field effect transistors. Additionally, since the emitters of the transistors comprise doped polysilicon material a relatively large current gain can be obtained, which reduces the amount of current needed on the word lines 130 to induce the phase change in the memory elements. The reduced amount of current needed on the word lines 130 reducing the cross-talk between devices sharing the same word line, thus improving the performance of the array.

Figure 3A:
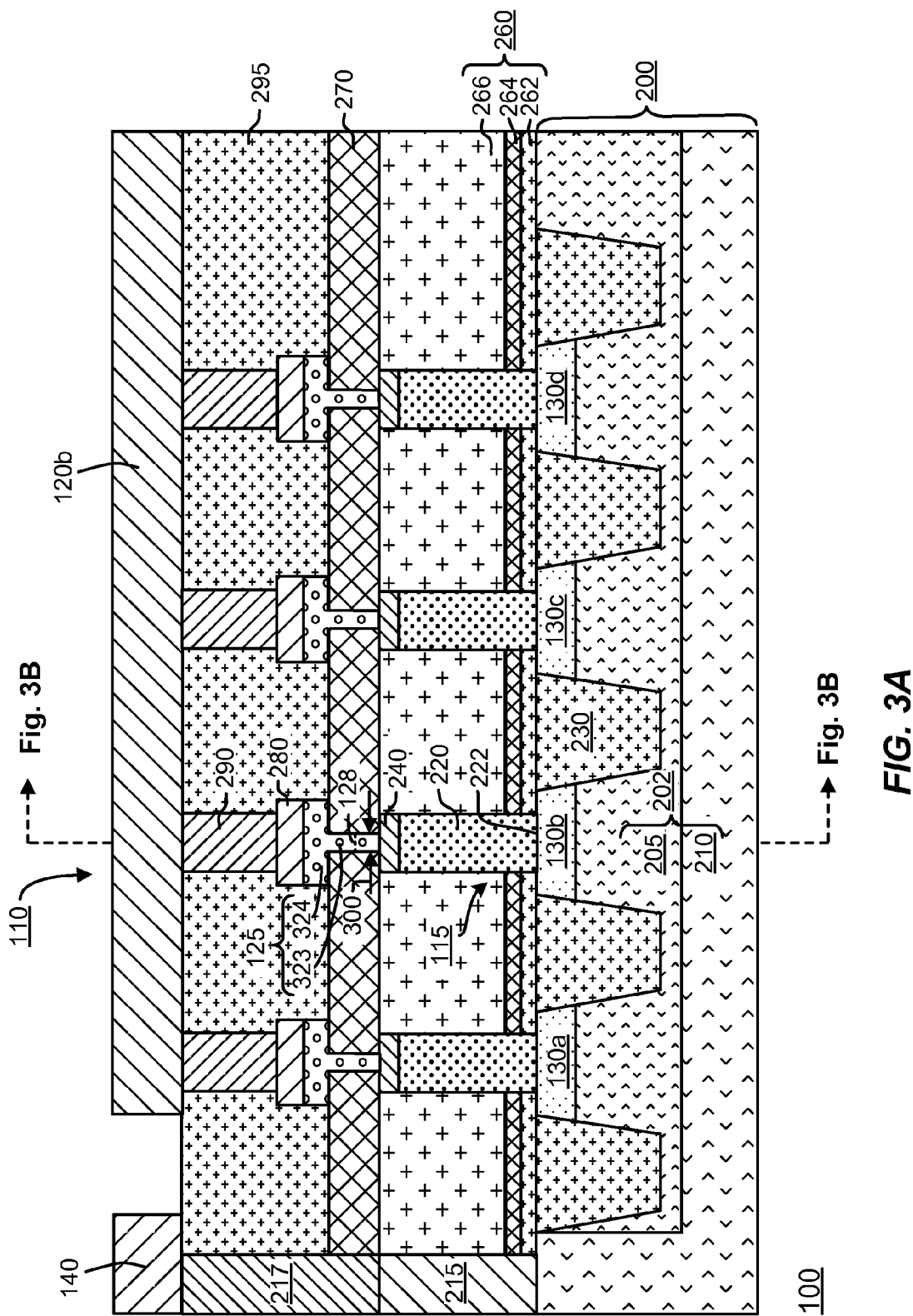
FIGS. 3A-3B illustrate cross-sectional views of a portion of a second embodiment of memory cells arranged in an array.
Figure 3B:
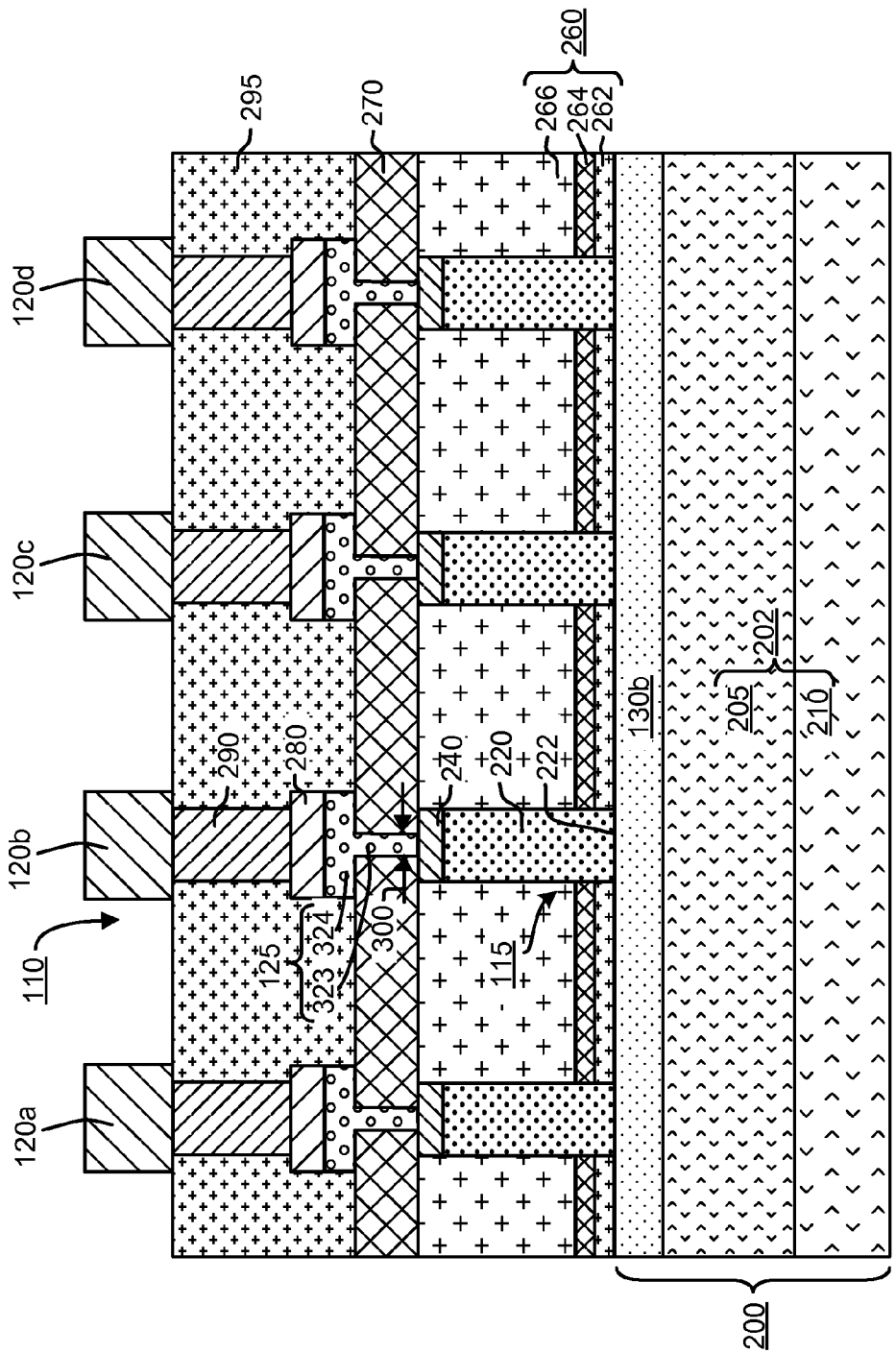

FIGS. 3A and 3B illustrate cross-sectional views of a portion of a second embodiment of memory cells (including representative memory cell 110) arranged in the array 100, FIG. 3A taken along the bit lines 120 and FIG. 3B taken along the word lines 130.

In the embodiment of FIGS. 3A and 3B the memory element 125 comprises a first portion 323 extending through dielectric layer 270 to contact the conductive cap 240, the first portion 123 being surrounded by the dielectric layer 270. The memory element 125 also includes a second portion 324 on the first portion 323. The memory element 125 couples the conductive cap 240 to the top electrode 280.

As can be appreciated, the active region 128 can be made extremely small in the illustrated structure, thus reducing the magnitude of the current needed to induce a phase change. The width 300 of the first portion 323 of the memory element 125 is less than that of the conductive cap 240 and the second portion 324 of the memory element 125, and preferably less than a minimum feature size for a process, typically a lithographic process, used to form the array 100. The small first portion 323 of the memory element concentrates current density in the first portion 323 of the memory element 125, thereby reducing the magnitude of the current needed to induce a phase change in the active region 128. Additionally, the dielectric layer 270 preferably comprises material providing some thermal isolation to the active region 128, which also helps to reduce the amount of current necessary to induce a phase change. Furthermore, the second portion 324 of the memory element 125 and the remaining part of the first portion 323 can provide some thermal isolation from the top electrode 280 for the active region 128.

Figure 4A:
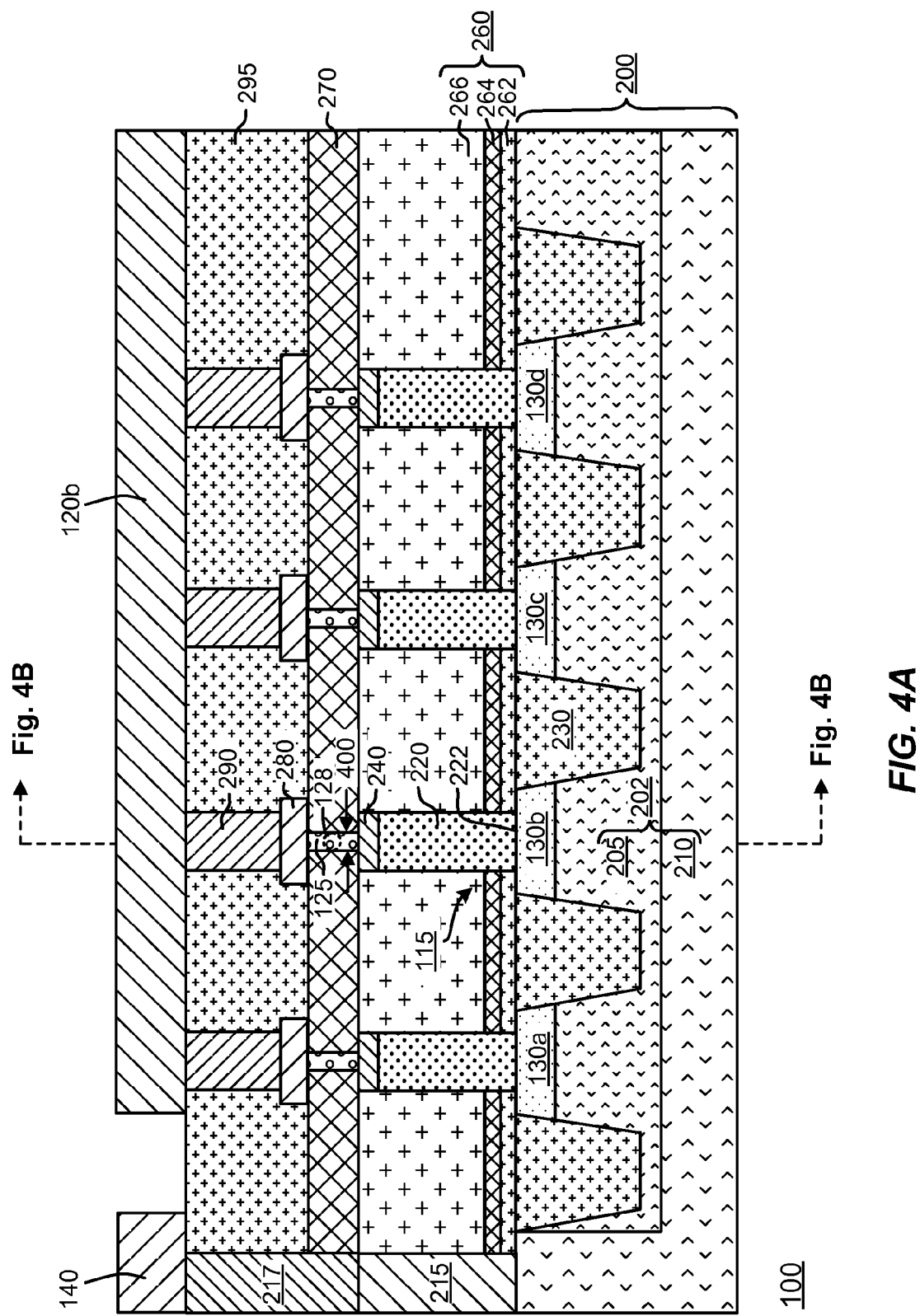
FIGS. 4A-4B illustrate cross-sectional views of a portion of a third embodiment of memory cells arranged in an array.
Figure 4B:
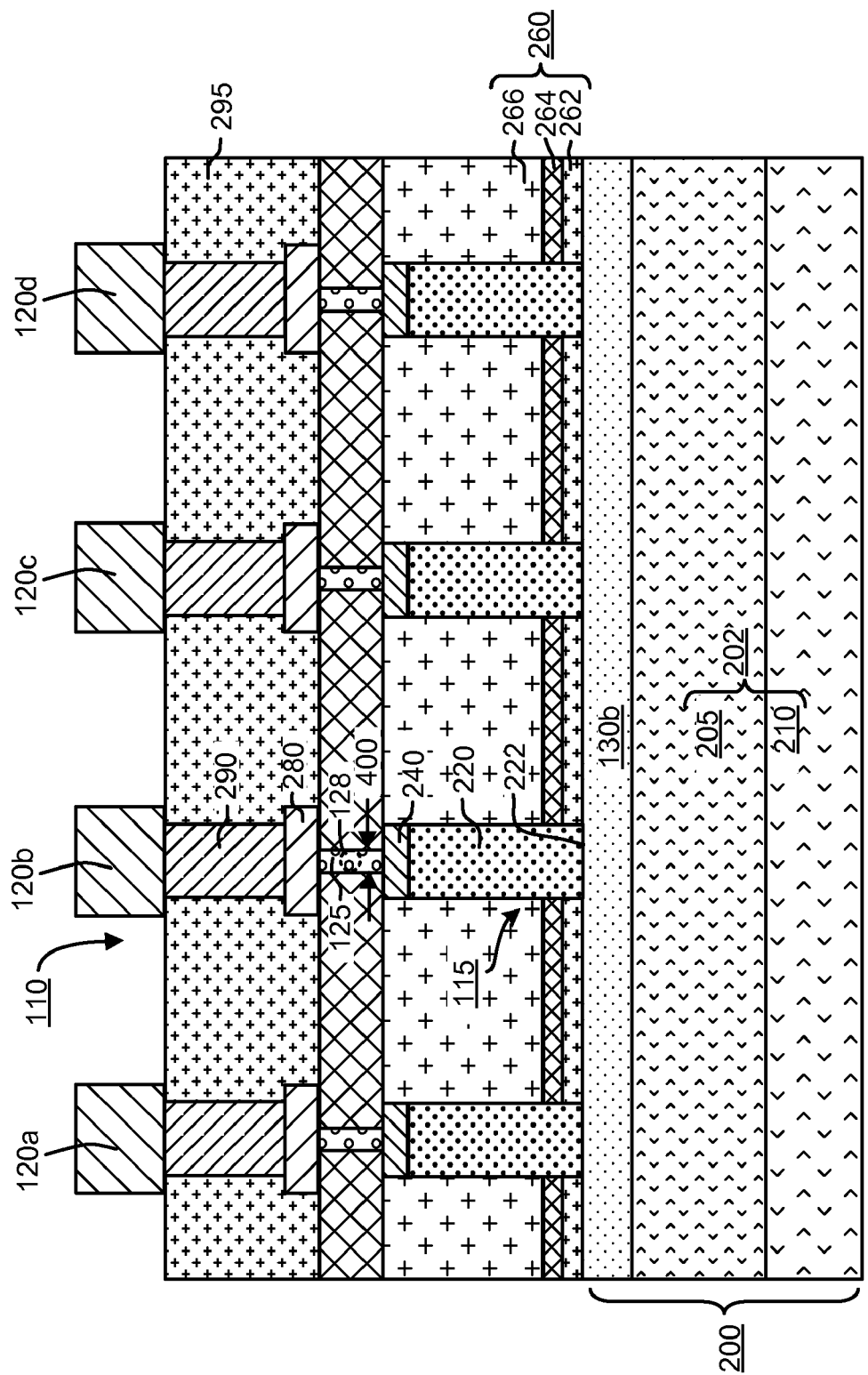

FIGS. 4A and 4B illustrate cross-sectional views of a portion of a third embodiment of memory cells (including representative memory cell 110) arranged in the array 100, FIG. 4A taken along the bit lines 120 and FIG. 4B taken along the word lines 130.

In the embodiment of FIGS. 4A and 4B the memory element 125 comprises a pillar of memory material extending through dielectric 270 to couple the conductive cap to the top electrode 280, the dielectric 270 surrounding the memory element 125.

As can be appreciated, the active region 128 can be made extremely small in the illustrated structure, thus reducing the magnitude of the current needed to induce a phase change. The width 400 of the memory element 125 is less than that of the conductive cap 240 and the top electrode 280, and preferably less than a minimum feature size for a process, typically a lithographic process, used to form the array 100.

This difference in width concentrates current in the small pillar shaped memory element 125, thereby reducing the magnitude of the current needed to induce a phase change in the active region 128. Additionally, dielectric layer 270 preferably comprises material providing some thermal isolation to the active region 128, which also helps to reduce the amount of current necessary to induce a phase change. Furthermore, the active region 128 can be spaced away from the conductive cap 240 and the top electrode 280, the remaining portions of the memory element 125 also providing some thermal isolation to the active region 128.

Figure 5B:
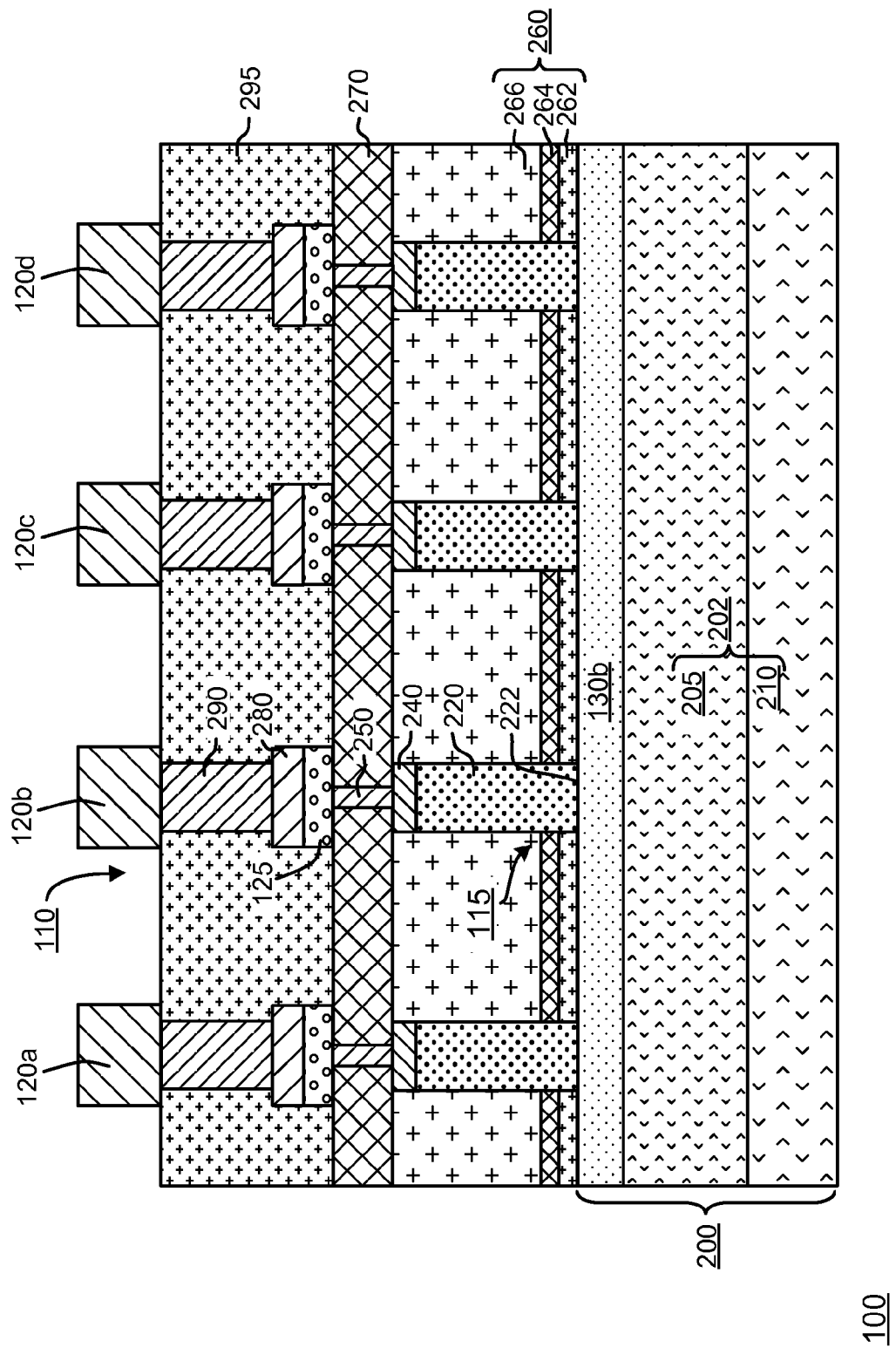

FIGS. 5A and 5B illustrate cross-sectional views of a portion of a fourth embodiment of memory cells (including representative memory cell 110) arranged in the array 100, FIG. 5A taken along the bit lines 120 and FIG. 5B taken along the word lines 130.

The embodiment of FIGS. 5A and 5B is similar to the embodiment of FIGS. 2A-2C, with sidewall conductors 510 on the sidewall surfaces of the word lines 130. In the illustrated embodiment the sidewall conductors 510 comprise a self-aligned silicide (salicide) containing, for example, Ti, W, Co, Ni, or Ta. The sidewall conductors 510 increase the electrical conductivity of the word lines 130 and thus reduce the loading of the word lines and improves the uniformity of the array.

Embodiments of the memory cells described herein include phase change based memory materials, including chalcogenide based materials and other materials, for the memory element. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_a Ge_b Sb_{100-(a+b)}$. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. These percentages are atomic percentages that total 100% of the atoms of the constituent elements. (Ovshinsky U.S. Pat. No. 5,687,112 patent, cols. 10-11.) Particular alloys evaluated by another researcher include Ge2Sb2Te5, GeSb2Te4 and GeSb4Te7 (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g., U.S. Pat. No. 6,800,504, and U.S. Patent Application Publication No. U.S. 2005/0029502.

Phase change alloys are capable of being switched between a first structural state in which the material is in a generally amorphous solid phase, and a second structural state in which the material is in a generally crystalline solid phase in its local order in the active channel region of the cell. These alloys are at least bistable. The term amorphous is used to refer to a relatively less ordered structure, more disordered than a single crystal, which has the detectable characteristics such as higher electrical resistivity than the crystalline phase. The term crystalline is used to refer to a relatively more ordered structure, more ordered than in an amorphous structure, which has detectable characteristics such as lower electrical resistivity than the amorphous phase. Typically, phase change materials may be electrically switched between different detectable states of local order across the spectrum between completely amorphous and completely crystalline states. Other material characteristics affected by the change between amorphous and crystalline phases include atomic order, free electron density and activation energy. The material may be switched either into different solid phases or into mixtures of two or more solid phases, providing a gray scale between completely amorphous and completely crystalline states. The electrical properties in the material may vary accordingly.

Phase change alloys can be changed from one phase state to another by application of electrical pulses. It has been observed that a shorter, higher amplitude pulse tends to change the phase change material to a generally amorphous state. A longer, lower amplitude pulse tends to change the phase change material to a generally crystalline state. The energy in a shorter, higher amplitude pulse is high enough to allow for bonds of the crystalline structure to be broken and short enough to prevent the atoms from realigning into a crystalline state. Appropriate profiles for pulses can be determined, without undue experimentation, specifically adapted to a particular phase change alloy. In following sections of the disclosure, the phase change material is referred to as GST, and it will be understood that other types of phase change materials can be used. A material useful for implementation of a PCRAM described herein is $Ge_2Sb_2Te_5$.

Other programmable resistive memory materials may be used in other embodiments of the invention, including other materials that use different crystal phase changes to determine resistance, or other memory materials that use an electrical pulse to change the resistance state. Examples include materials for use in resistance random access memory (RRAM) such as metal-oxides including tungsten-oxide ($WO_x$), NiO, $Nb_2O_5$, $CuO_2$, $Ta_2O_5$, $Al_2O_3$, CoO, $Fe_2O_3$, $HfO_2$, $TiO_2$, $SrTiO_3$, $SrZrO_3$, $(BaSr)TiO_3$. Additional examples include materials for use in magnetoresistance random access memory (MRAM) such as spin-torque-transfer (STT) MRAM, for example at least one of CoFeB, Fe, Co, Ni, Gd, Dy, CoFe, NiFe, MnAs, MnBi, MnSb, $CrO_2$, $MnOFe_2O_3$, $FeOFe_2O_5$, $NiOFe_2O_3$, $MgOFe_2$, EuO, and $Y_3Fe_5O_{12}$. See, for example, US Publication No 2007/0176251 entitled "Magnetic Memory Device and Method of Fabricating the Same", which is incorporated by reference herein. Additional examples include solid electrolyte materials used for programmable-metallization-cell (PMC) memory, or nano-ionic memory, such as silver-doped germanium sulfide electrolytes and copper-doped germanium sulfide electrolytes. See, for example, N. E. Gilbert et al., "A macro model of programmable metallization cell devices," Solid-State Electronics 49 (2005) 1813-1819, which is incorporated by reference herein.

An exemplary method for forming chalcogenide material uses PVD-sputtering or magnetron-sputtering method with source gas(es) of Ar, $N_2$, and/or He, etc. at the pressure of 1 mTorr~100 mTorr. The deposition is usually done at room temperature. A collimator with an aspect ratio of 1~5 can be used to improve the fill-in performance. To improve the fill-in performance, a DC bias of several tens of volts to several hundreds of volts is also used. On the other hand, the combination of DC bias and the collimater can be used simultaneously.

A post-deposition annealing treatment in a vacuum or in an $N_2$ ambient is optionally performed to improve the crystallize state of chalcogenide material. The annealing temperature typically ranges from 100° C. to 400° C. with an anneal time of less than 30 minutes.

FIGS. 6-20 illustrate steps in a fabrication sequence for manufacturing an array of memory cells.

Figure 6A:
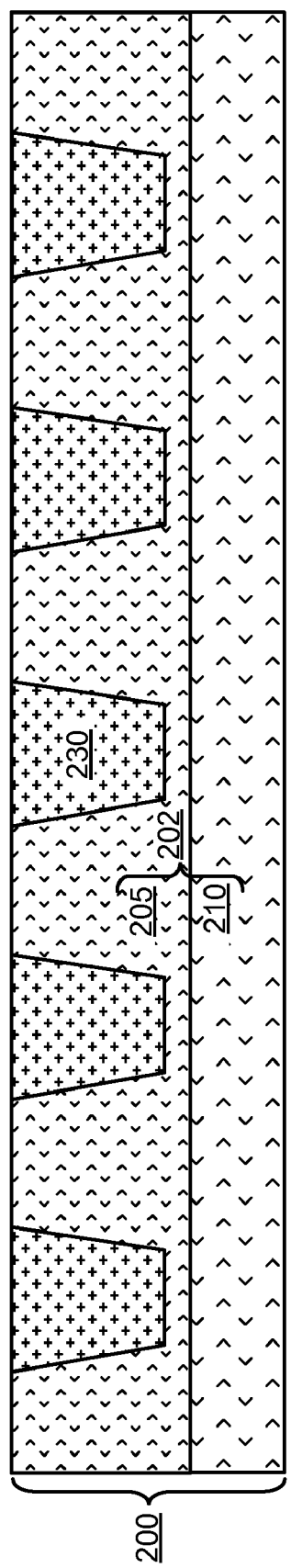
FIGS. 6-20 illustrate steps in a fabrication sequence for manufacturing the array of memory cells.
Figure 6B:
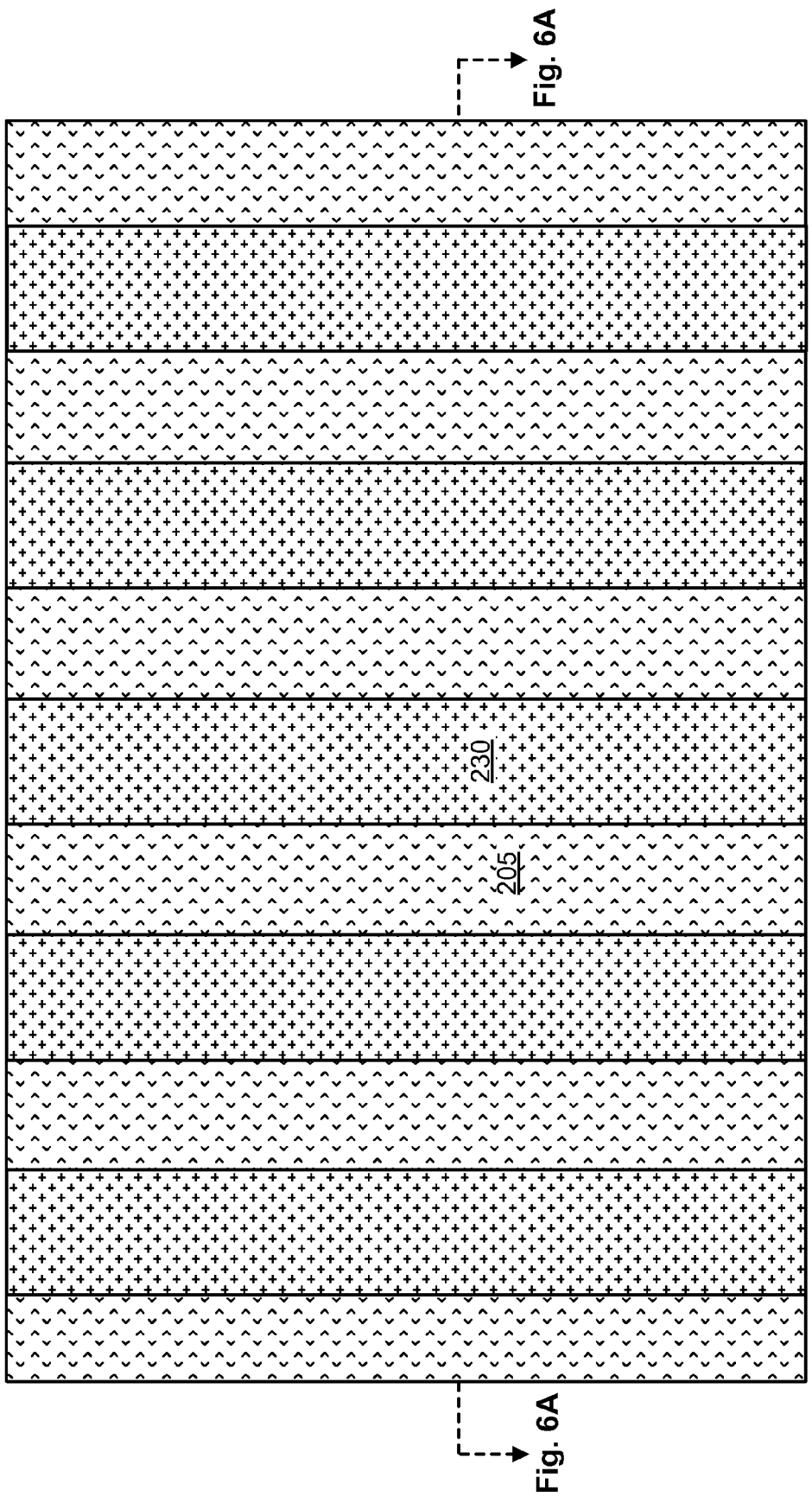

FIGS. 6A and 6B illustrate cross-sectional and top views of a first step of forming a substrate 200 comprising a well 202 comprising first and second doped regions 205, 210 and dielectric trenches 230 within the well 202 and extending into and out of the cross-section illustrated in FIG. 6A. The first and second doped regions 205, 210 can be formed by implantation and activation annealing processes as known in the art. In the illustrated embodiment the first doped region comprises doped N type material of silicon substrate 200, and the second doped region 210 comprises highly doped N-type ($N^+$) material of silicon substrate 200. In an alternative embodiment the first doped region comprises doped P type material of silicon substrate 200, and the second doped region 210 comprises highly doped P-type ($P^+$) material of silicon substrate 200.

Next, ion implantation is performed to form word lines 130 within the first doped region 205 of the well, the word lines 130 having a conductivity type different from that of the first and second doped regions 205 and 210. Also, in the illustrated embodiment a second ion implantation step is performed within the substrate to form a highly doped region extending from the top surface of the substrate to the second doped region 210, resulting in the structure illustrated in FIGS. 7A and 7B. In the illustrated embodiment the word lines 130 comprise doped P-type material of silicon substrate 200. In an alternative embodiment the word lines 130 comprise doped N-type material of silicon substrate 200.

Figure 7A:
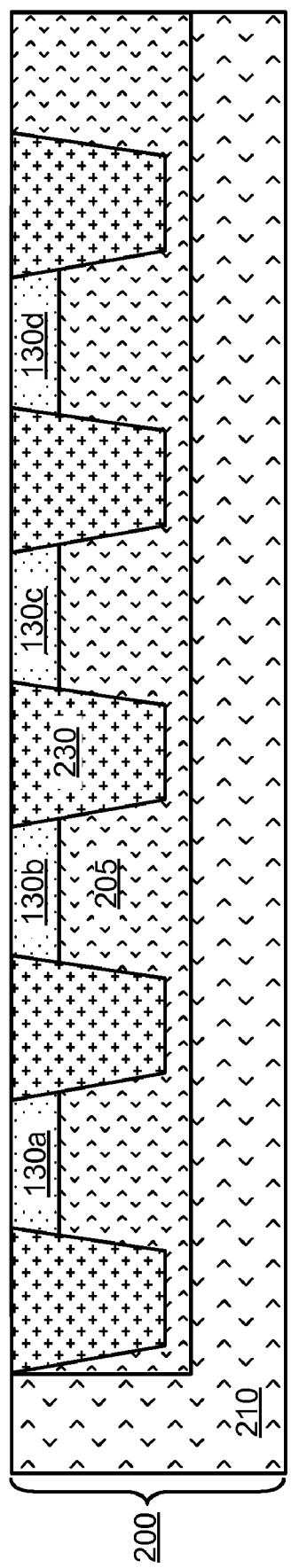
Figure 7B:
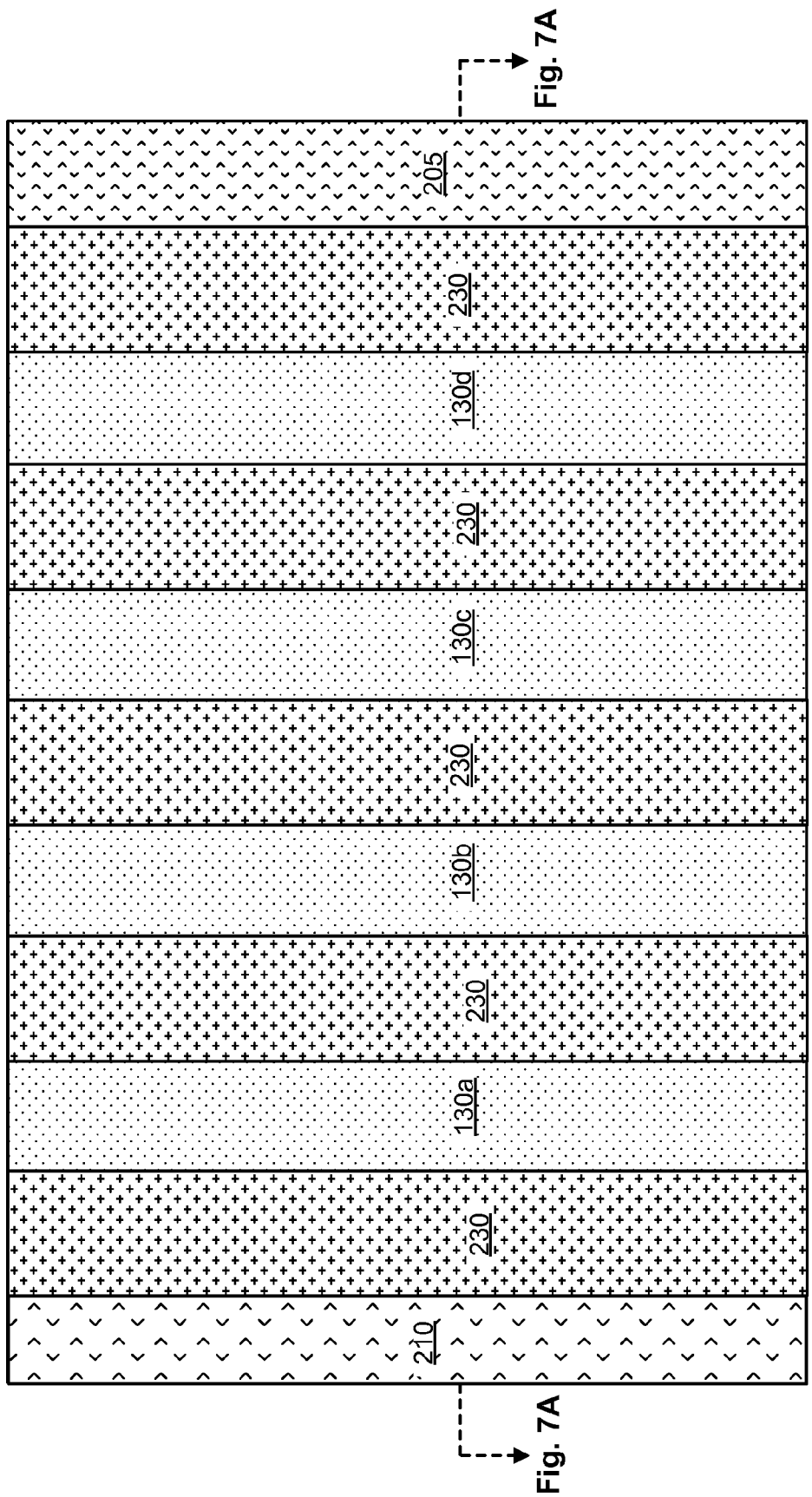
Figure 8A:
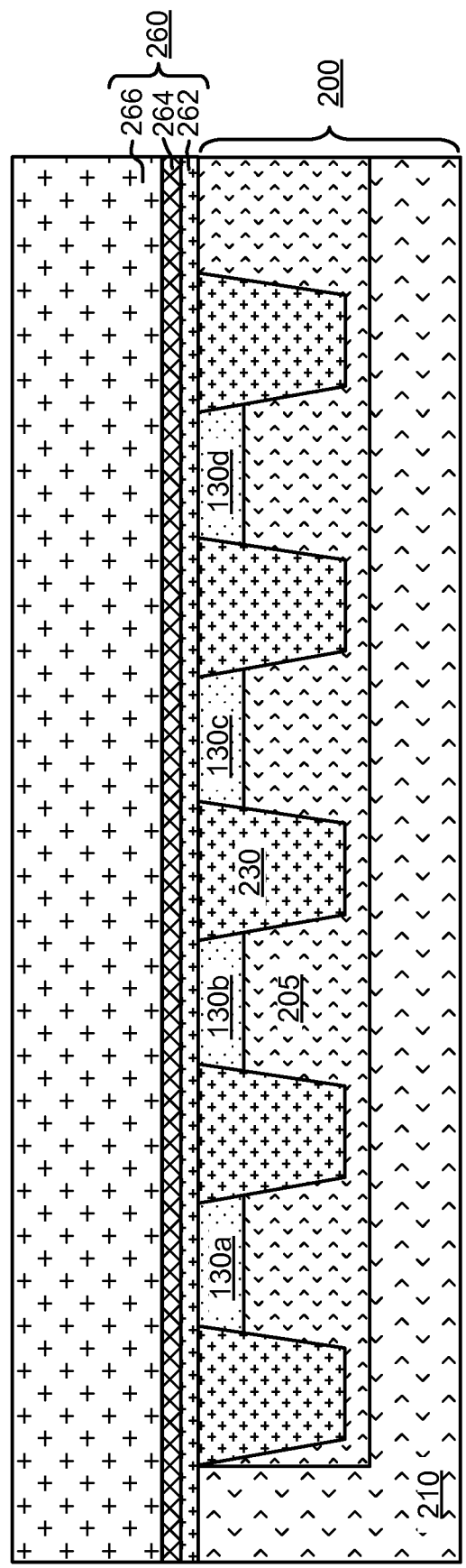
Figure 8B:
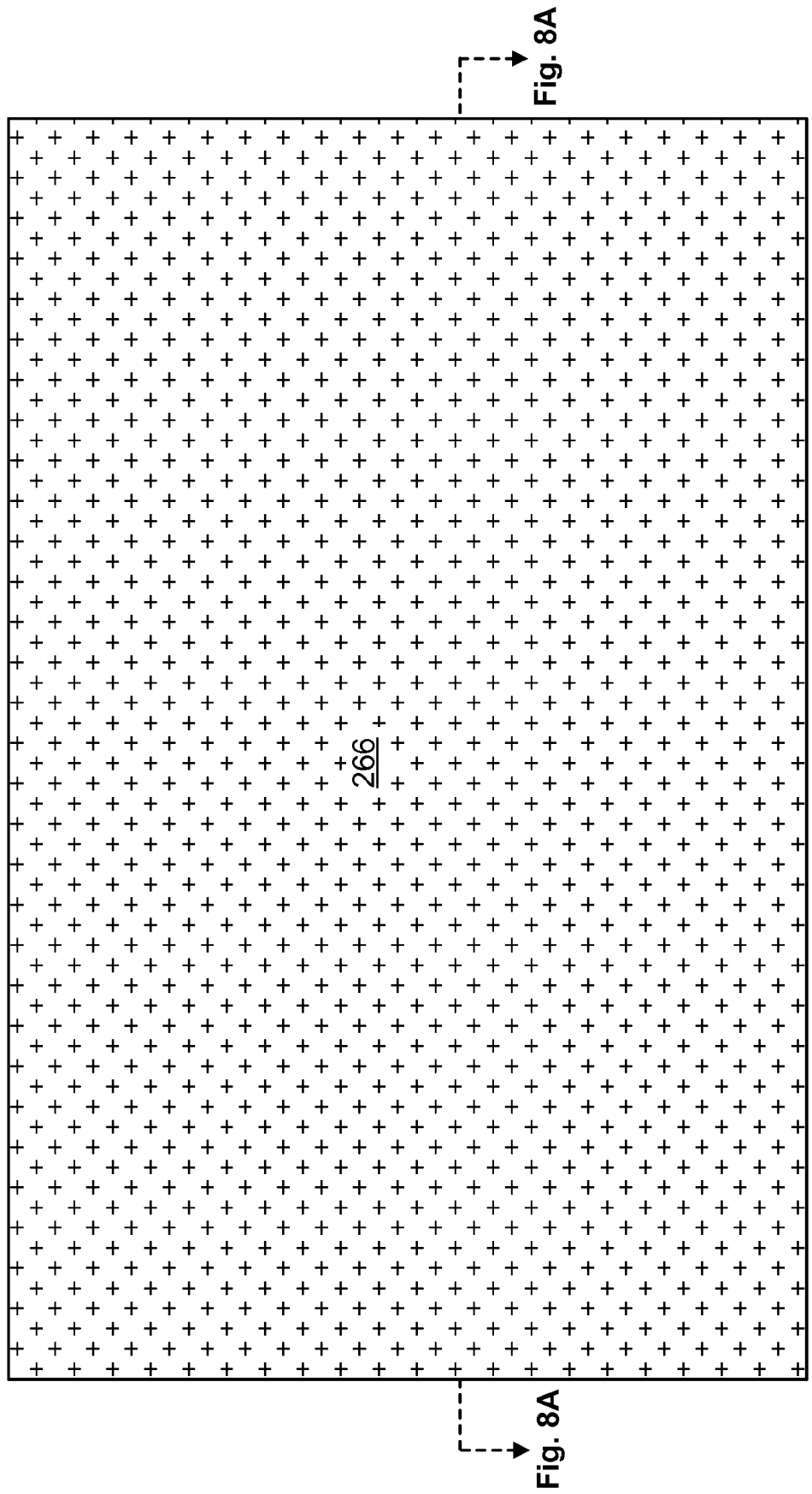

Next, dielectric 260 is formed on the structure illustrated in FIGS. 7A-7B, resulting in the structure illustrated in the cross-sectional and top views of FIGS. 8A-8B respectively. In the illustrated embodiment forming dielectric 260 comprises depositing a layer 262 comprising silicon dioxide on the substrate 200, depositing a layer 264 comprising silicon nitride on layer 262, and depositing a layer 266 comprising BPSG or PSG on the layer 264. In some alternative embodiments the layer 264 may be omitted.

Figure 9A:
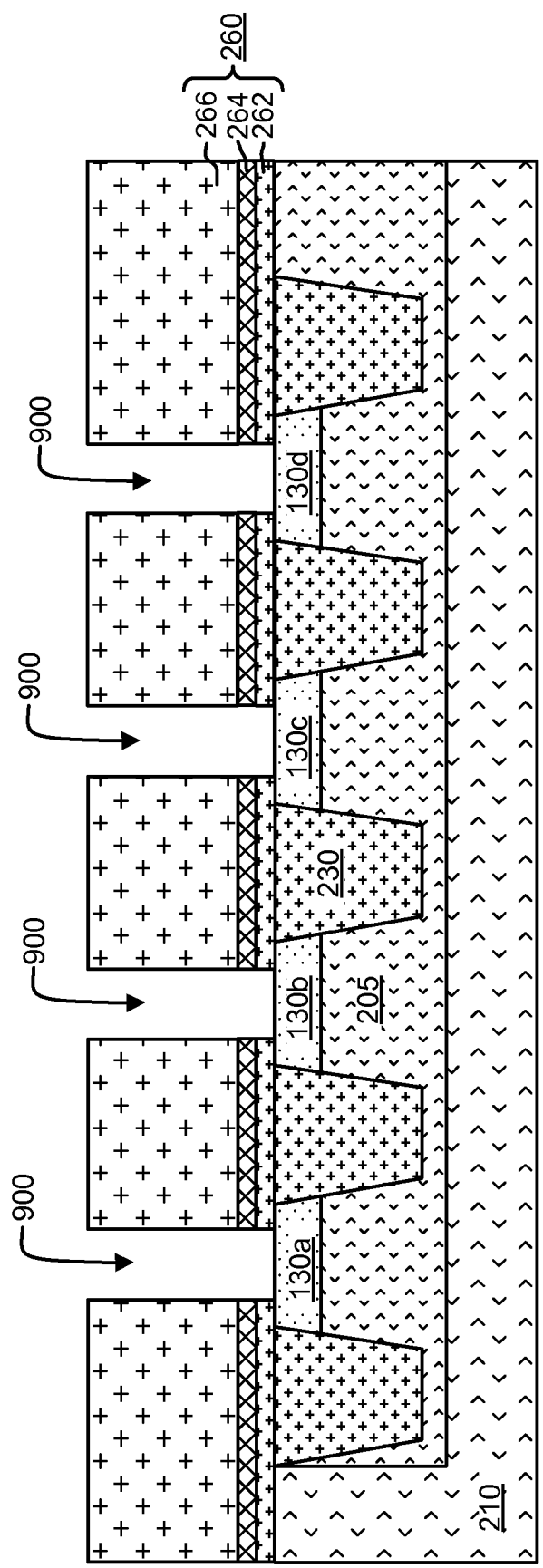
Figure 9B:
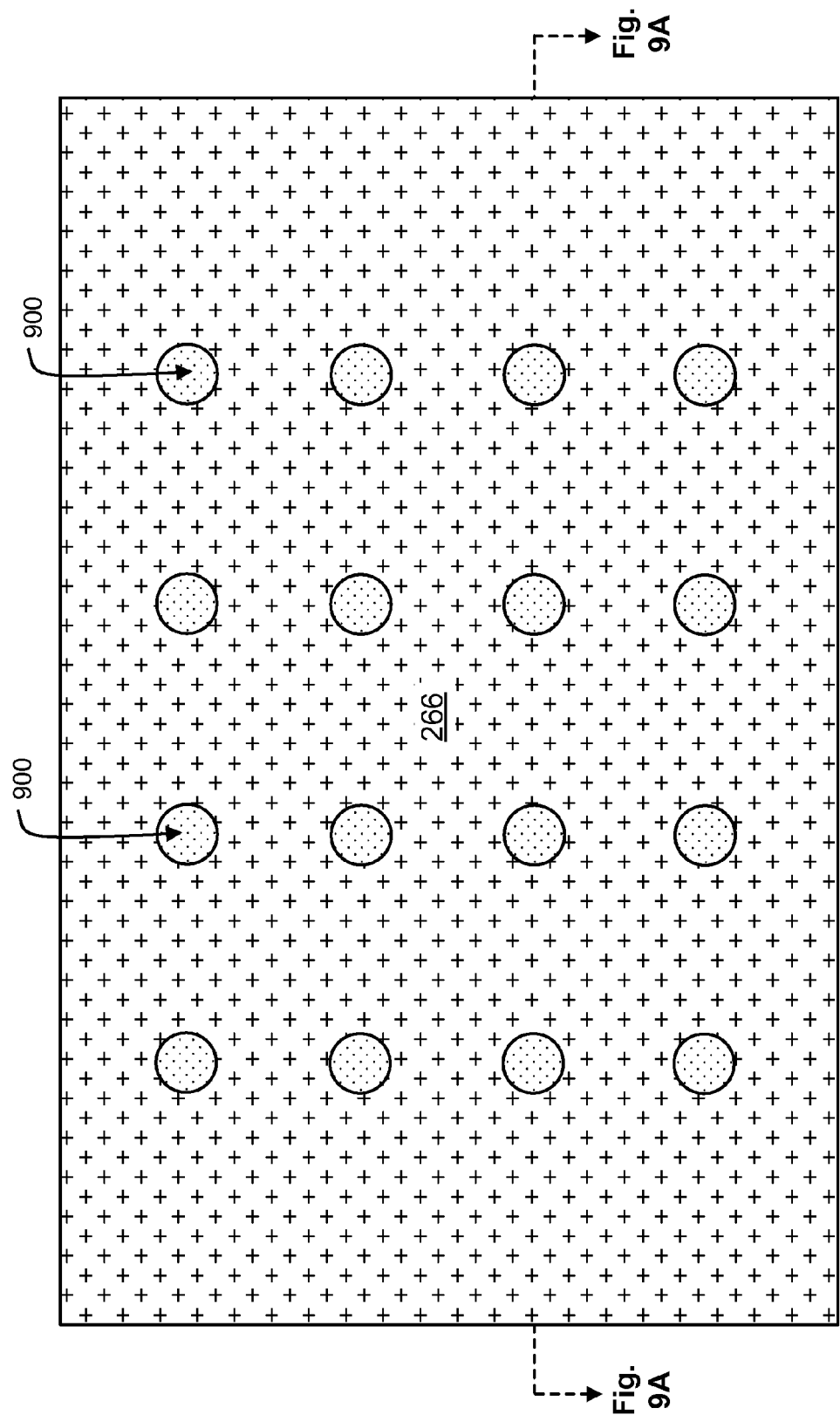

Next, openings 900 are formed through the dielectric 260 of the structure illustrated in FIGS. 8A-8B to expose top surfaces of the word lines 130, resulting in the structure illustrated in FIGS. 9A-9B. The openings 900 can be formed by first selectively etching through the layer 266 using layer 264 as an etch stop, then selectively etching through layer 264 to expose layer 262, and then selectively etching through layer 262 for example using a wet etching process to expose the word lines 130b. A damage free interface between the word lines 130 and the subsequently formed doped polysilicon plugs 220 is critical for obtaining a relatively large current in operation, and thus a wet etch process may be preferred through the layer 262 in order to prevent damage to the emitter-base interface, and in some embodiments it may be preferred that the wet etching does not remove all of the layer 262. Additionally, an optional reoxidation process may be performed and/or a high temperature annealing process in order to obtain a high quality interface between the word lines 130 and the subsequently formed plugs 220.

Figure 10A:
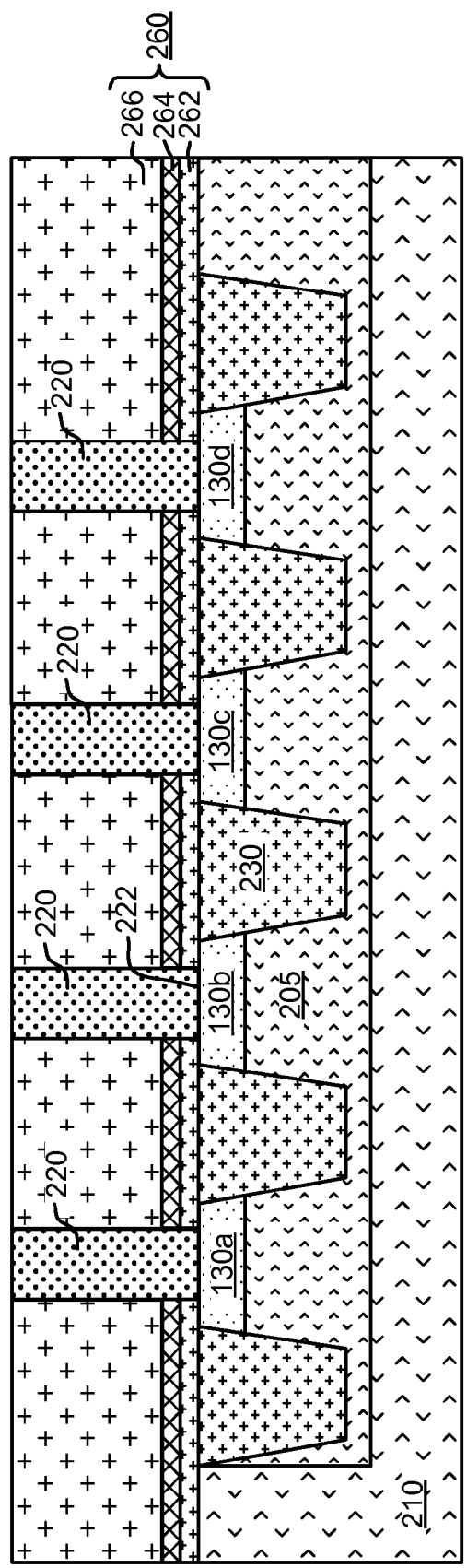
Figure 10B:
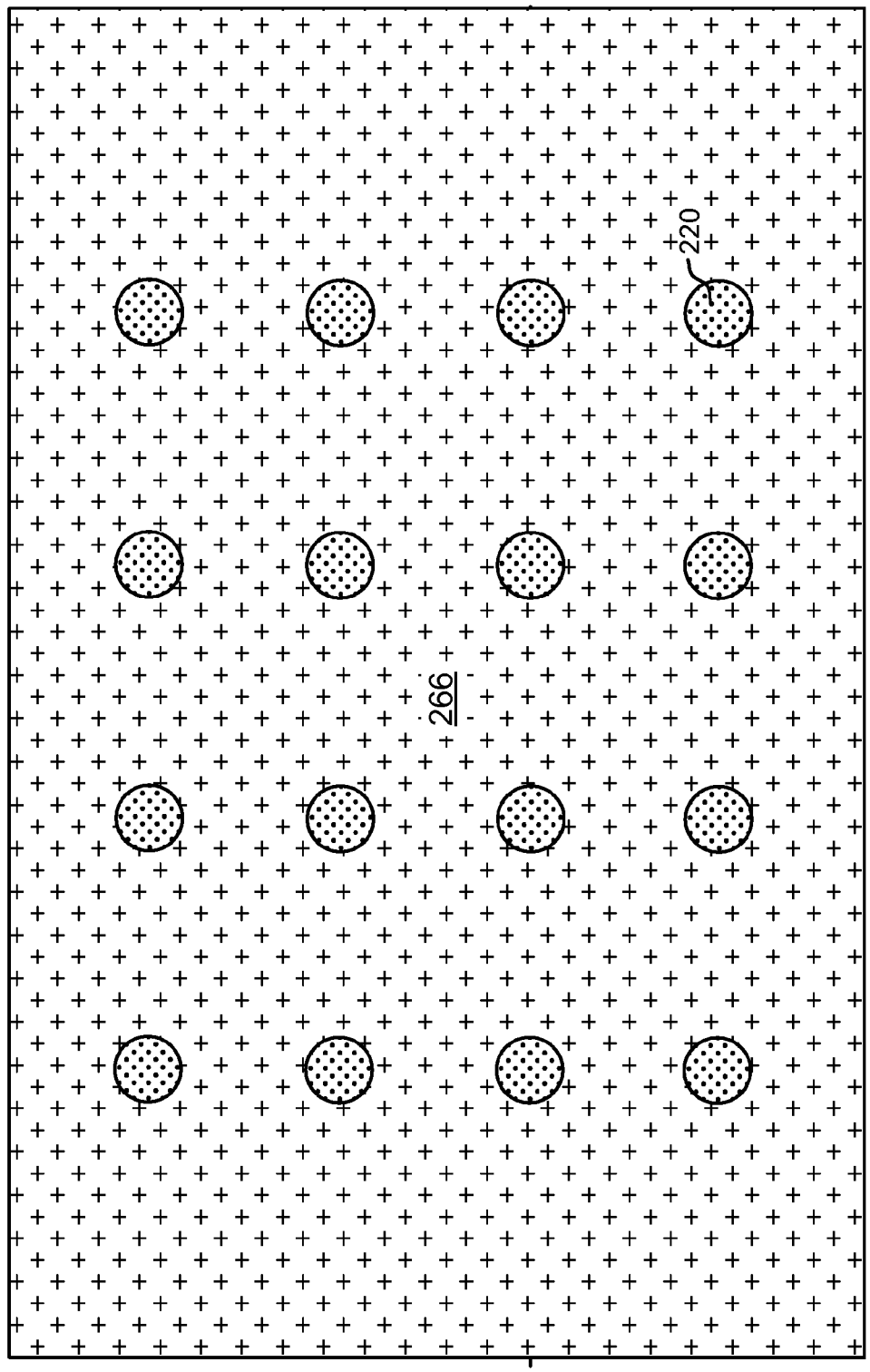

Next, doped polysilicon plugs 220 are formed in the openings 900 of the structure illustrated in FIGS. 9A-9B, resulting in the structure illustrated in the cross-sectional and top views of FIGS. 10A and 10B. The doped polysilicon plugs 220 have a conductivity different from that of the word lines 130, and thus the plugs 220 contact a corresponding word line 130 to define a pn junction 222 therebetween. The doped polysilicon plugs 220 may be formed by deposition of doped polysilicon material on the structure of FIGS. 9A-9B followed by a planarization process such as Chemical Mechanical Polishing CMP.

Figure 11A:
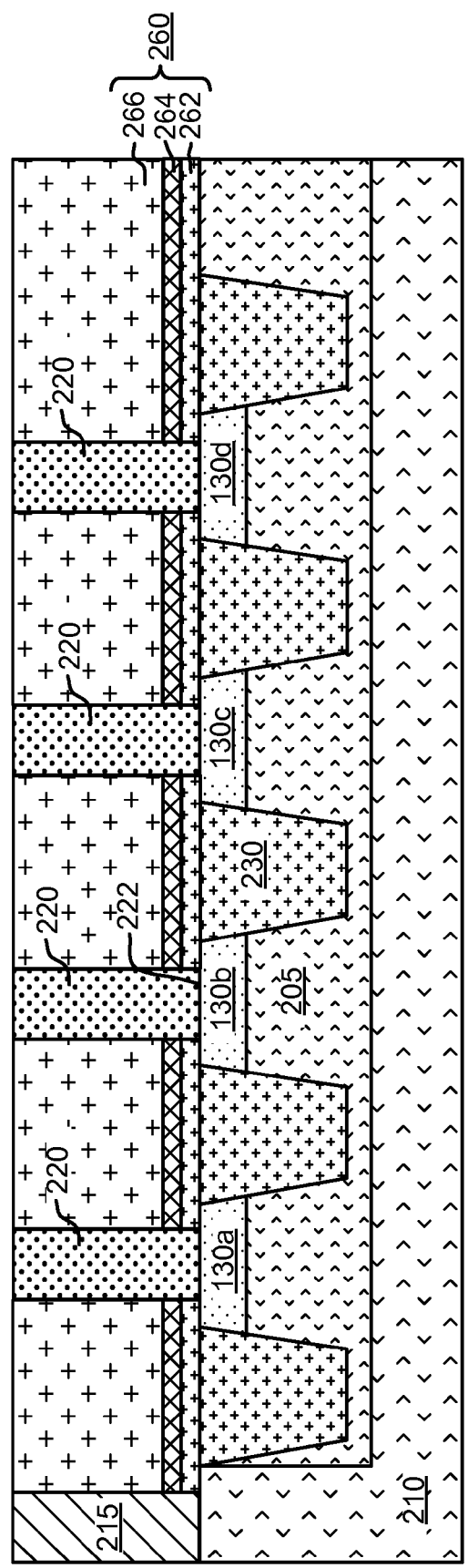
Figure 11B:
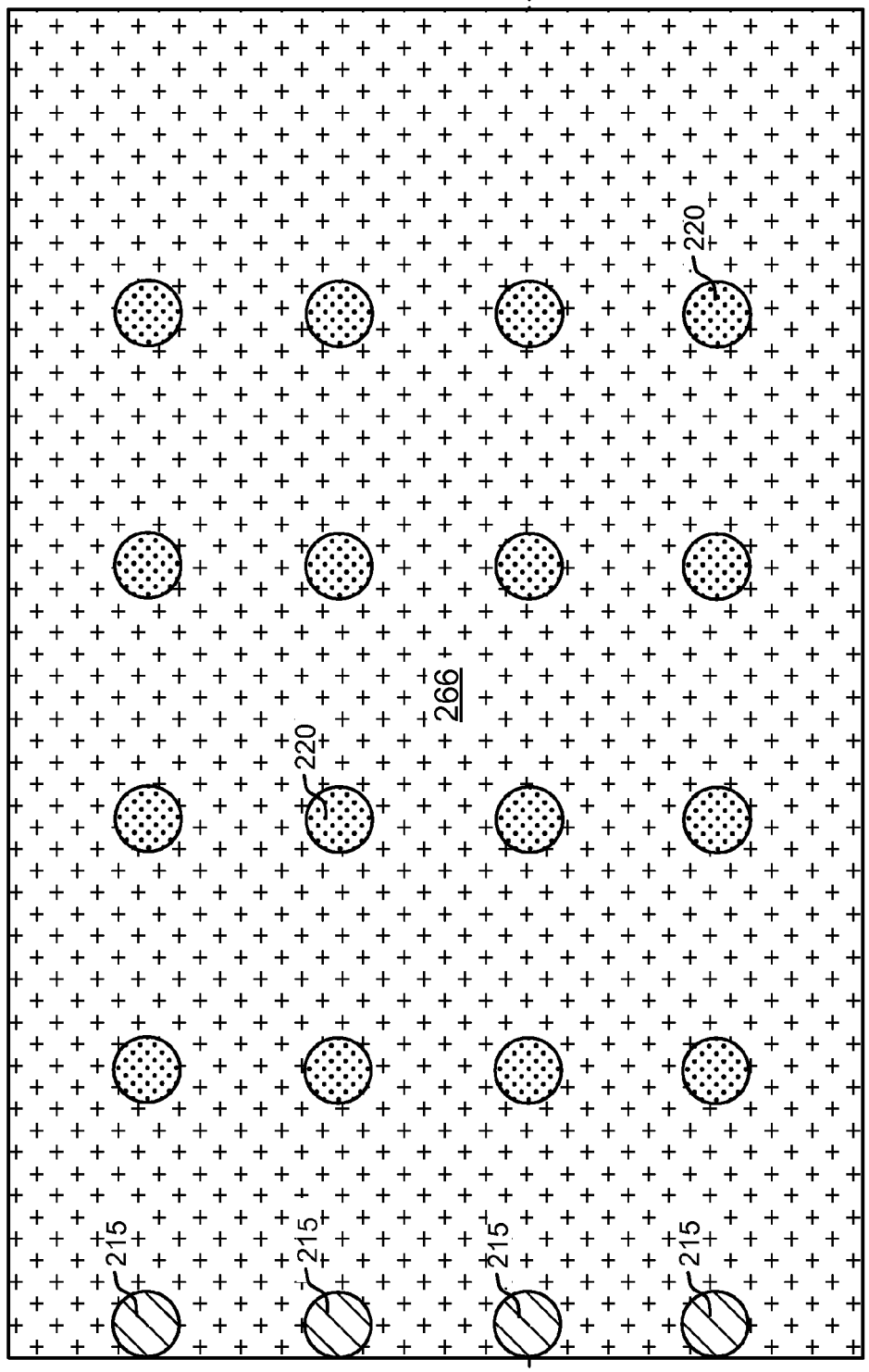

Next, a plurality of conductive contacts 215 are formed through the dielectric 260 to contact the second doped region 210 of the well of FIGS. 10A-10B, resulting in the structure illustrated in the cross-sectional and top views of FIGS. 11A and 11B. In the illustrated embodiment the conductive contacts 215 comprise tungsten.

Figure 12A:
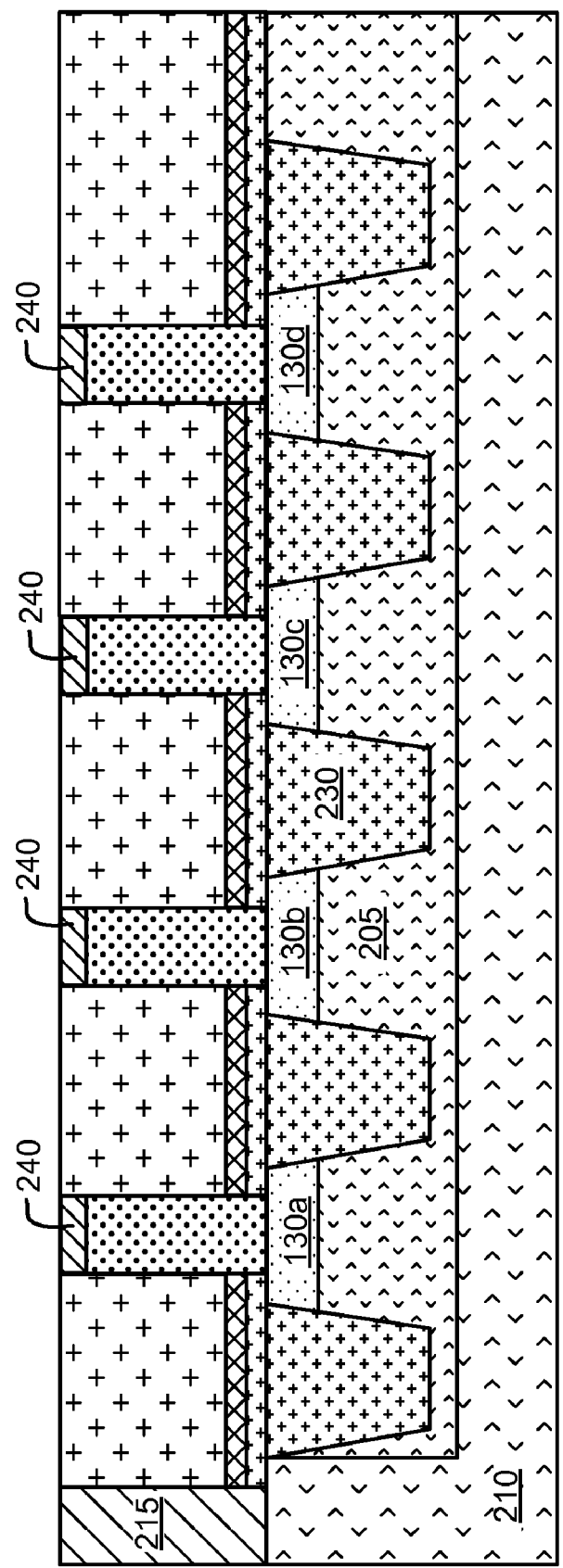
Figure 12B:
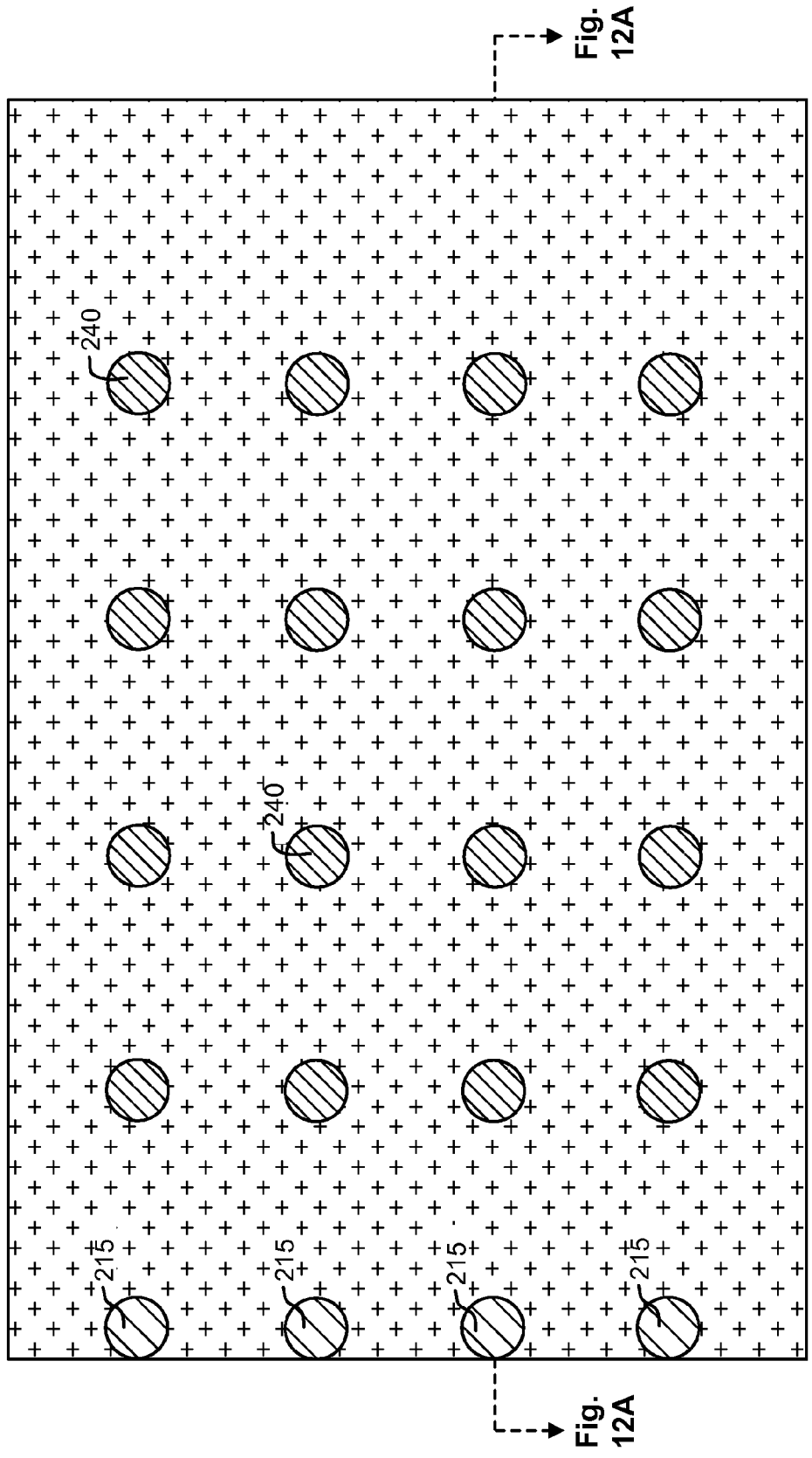

Next, conductive caps 240 are formed on the doped polysilicon plugs 220 of FIGS. 11A-11B, resulting in the structure illustrated in the cross-sectional and top views of FIGS. 12A and 12B. The conductive caps 240 comprise a silicide containing, for example, Ti, W, Co, Ni, or Ta. In one embodiment the caps 240 comprise cobalt silicide (CoSi) and is formed by depositing a layer of cobalt and performing a rapid thermal process (RTP) such that the cobalt reacts with the silicon of the plugs 220 to form the conductive caps 240. It is understood that other silicides may also be formed in this manner by depositing titanium, arsenic, doped nickel, or alloys thereof, in a manner similar to the example described herein using cobalt.

Figure 13A:
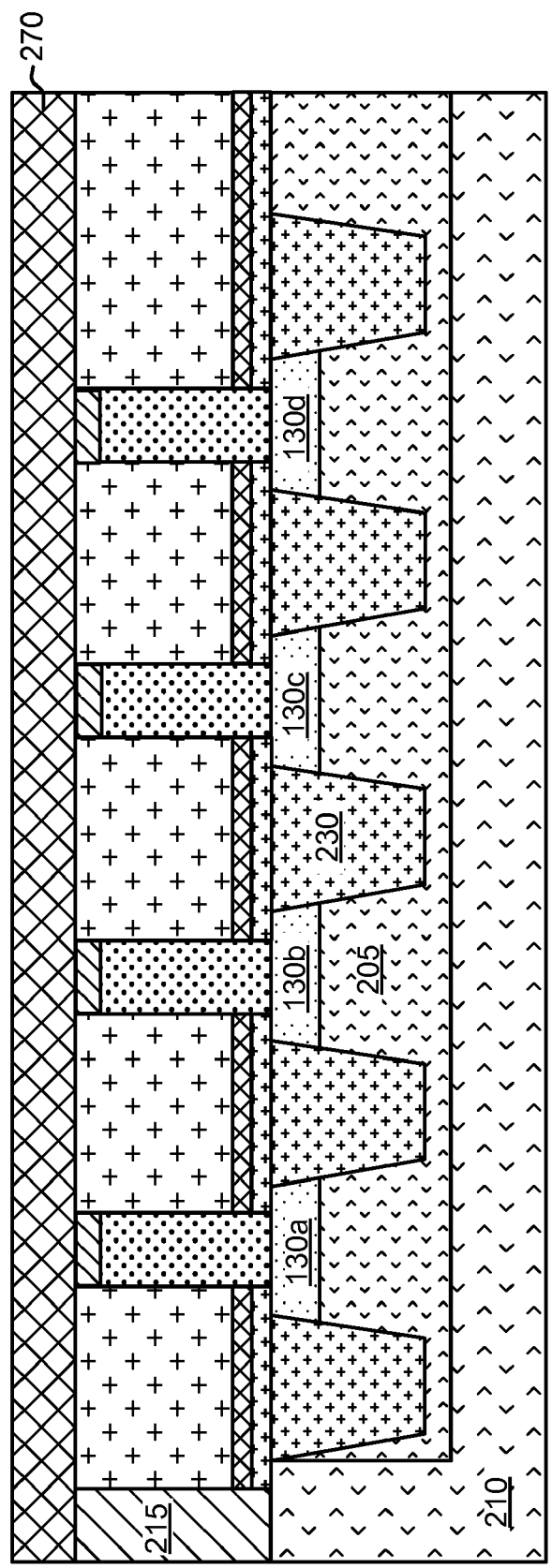
Figure 13B:
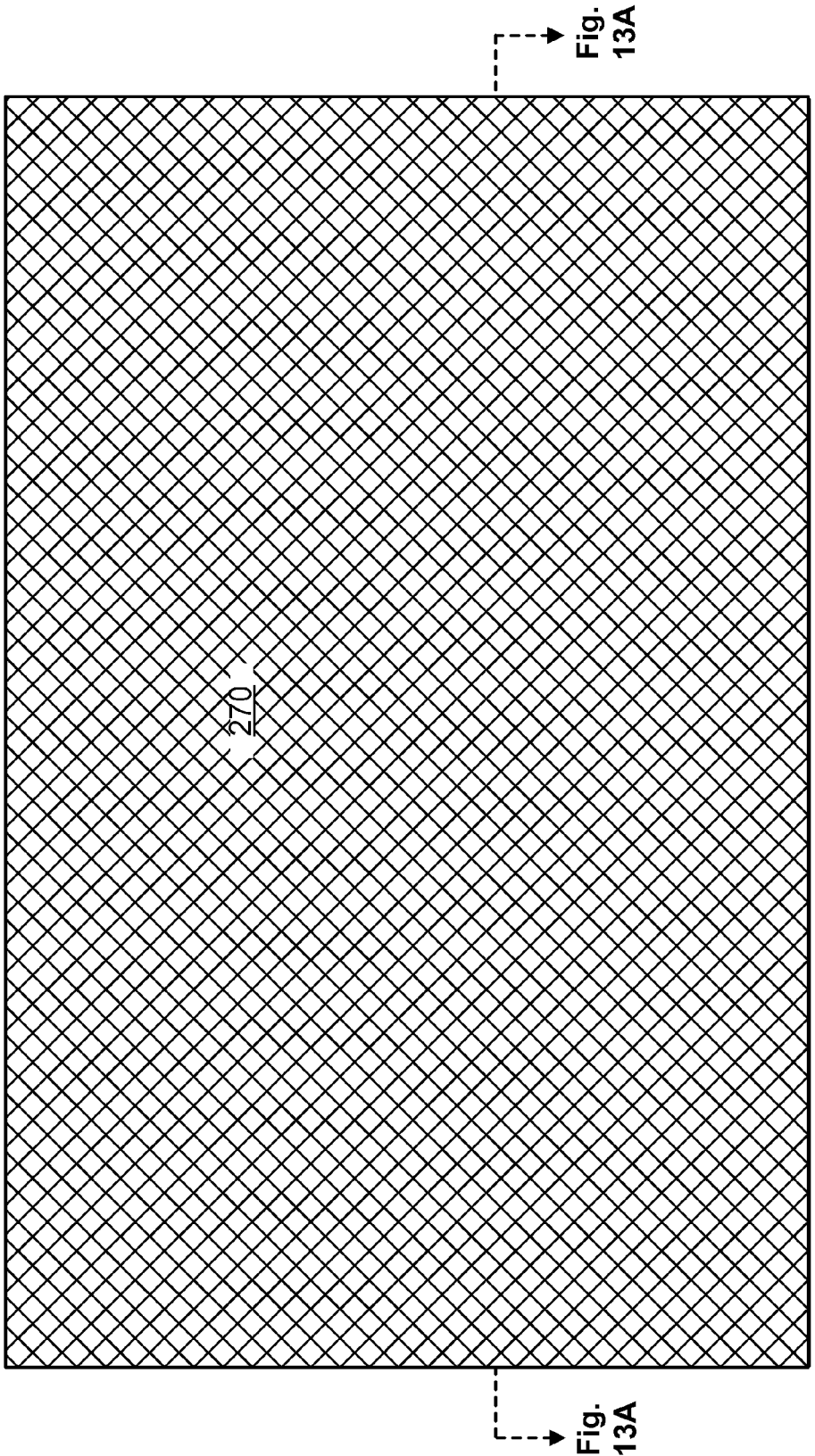

Next, dielectric layer 270 is formed on the structure illustrated in FIGS. 12A-12B, resulting in the structure illustrated in the cross-sectional and top views of FIGS. 13A and 13B. In the illustrated embodiment the dielectric layer 270 comprises silicon nitride.

Figure 14A:
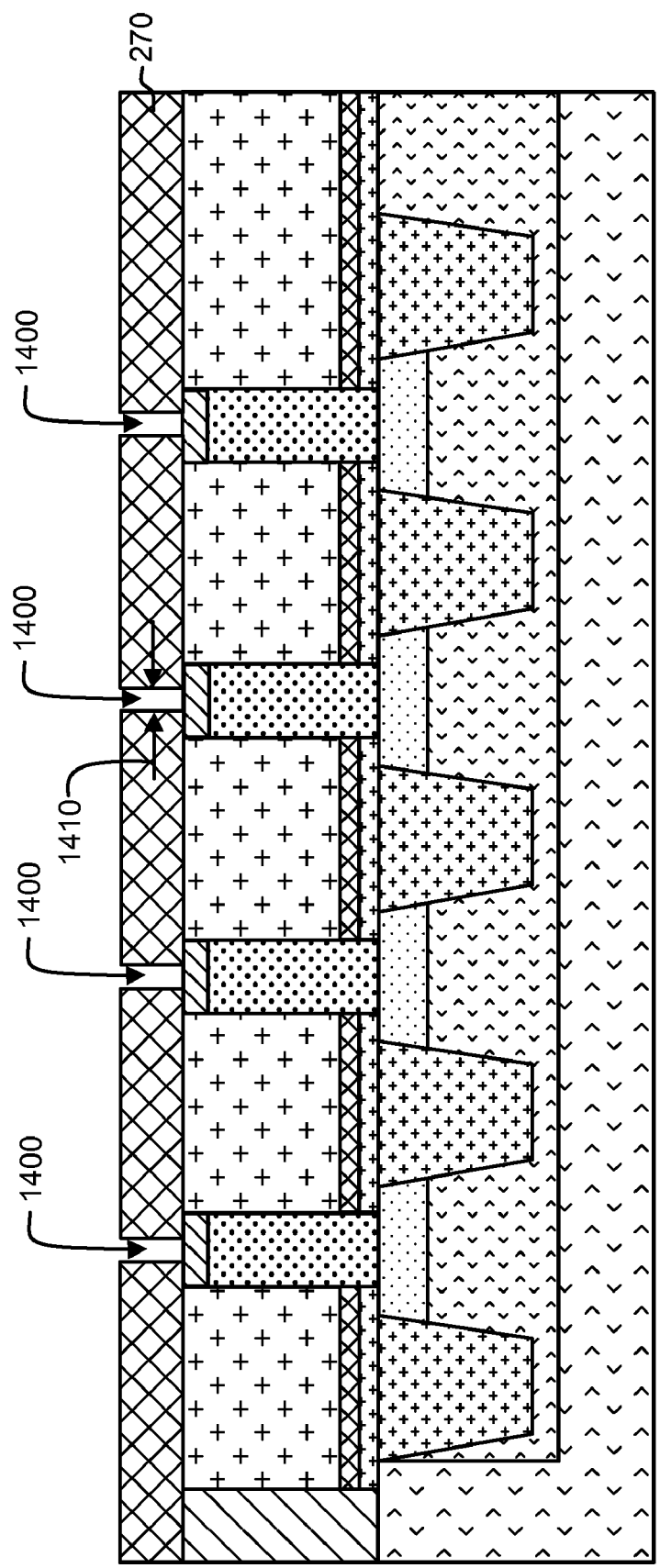
Figure 14B:
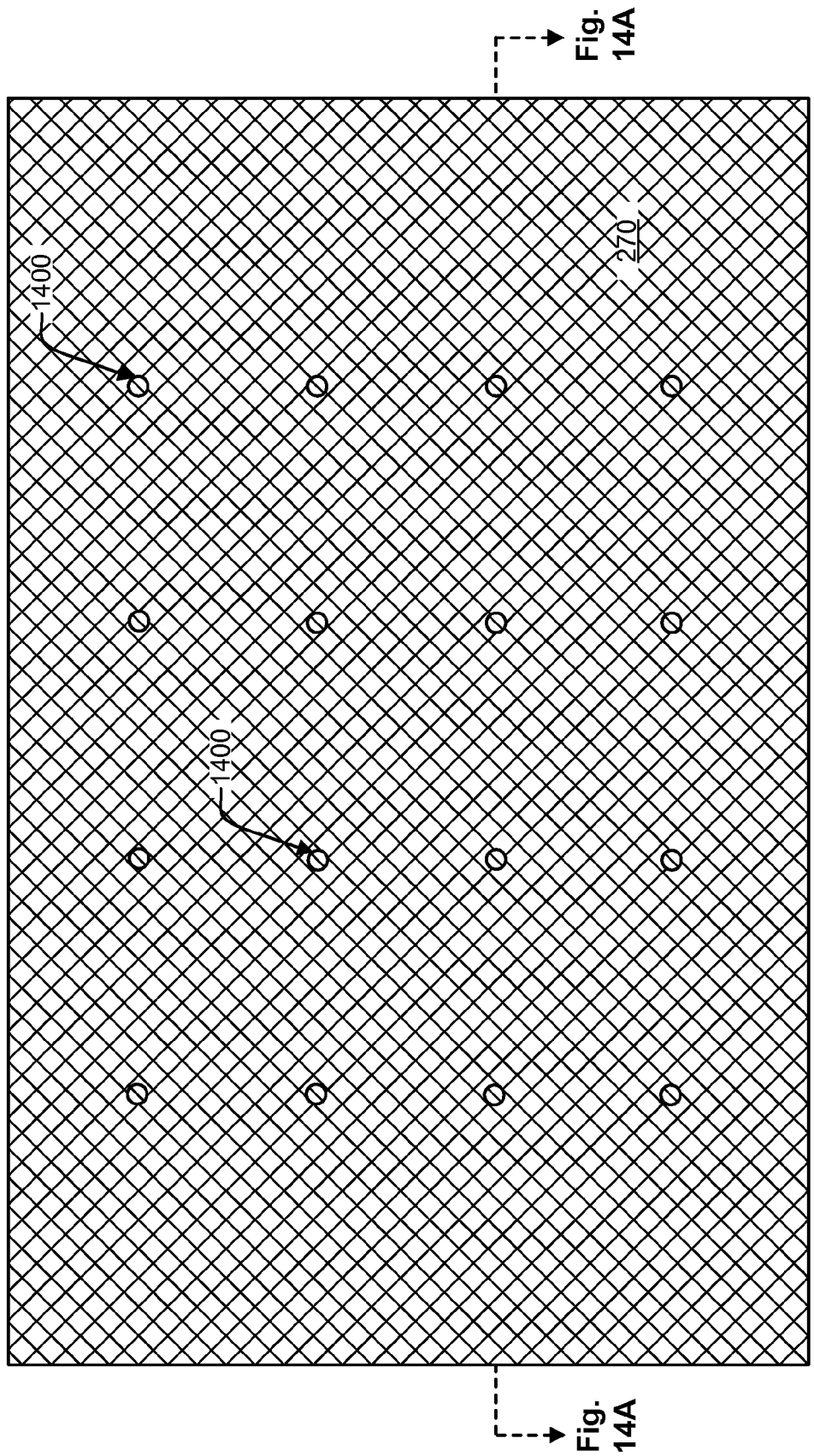

Next, openings 1400 are formed through the dielectric 270 of FIGS. 13A-13B to expose top surfaces of the conductive caps 240, resulting in the structure illustrated in the cross-sectional and top views of FIGS. 14A and 14B. The openings 1400 have a width 1410 which is preferably sublithographic. In the illustrated embodiment the openings 1400 have a circular cross-section and thus the width 1410 is a diameter. However, in embodiments the openings 1400 may have a cross-section that that is square, elliptical, rectangular, or somewhat irregularly shaped, depending on the manufacturing technique applied to form the openings 1400.

The openings 1400 having a sublithographic width 1410 can be formed, for example, using methods, materials, and processes as disclosed in U.S. patent application Ser. No. 11/855979 filed 14 Sep. 2007 entitled "Phase Change Memory Cell in Via Array with Self-Aligned, Self-Converged Bottom Electrode and Method for Manufacturing", which is incorporated by reference herein. For example, an isolation layer is formed on the dielectric 270 and a sacrificial layer is formed on the isolation layer. Next, a mask having openings close to or equal to the minimum feature size of the process used to create the mask is formed on the sacrificial layer, the openings overlying the locations of the openings 1400. The isolation layer and the sacrificial layer are then selectively etched using the mask, thereby forming vias in the isolation and sacrificial layers and exposing a top surface of the dielectric 270. After removal of the mask, a selective undercutting etch is performed on the vias such that the isolation layer is etched while leaving the sacrificial layer and the dielectric 270 intact. A fill material is then formed in the vias, which due to the selective undercutting etch process results in a self-aligned void in the fill material being formed within each via. Next, an anisotropic etching process is performed on the fill material to open the voids, and etching continues until the dielectric 270 is exposed in the region below the void, thereby forming a sidewall spacer comprising fill material within each via. The sidewall spacers have an opening dimension substantially determined by the dimensions of the void, and thus can be less than the minimum feature size of a lithographic process. Next, the dielectric 270 is etched using the sidewall spacers as an etch mask, thereby forming openings 1400 having a width 1410 less than the minimum feature size. The isolation layer and the sacrificial layer can be removed by a planarization process such as CMP, resulting in a structure as illustrated in FIGS. 14A-14B. Alternatively, the isolation layer and the sacrificial layer can be removed by a planarization process after material (such as electrode material) is formed in the openings 1400.

Figure 15A:
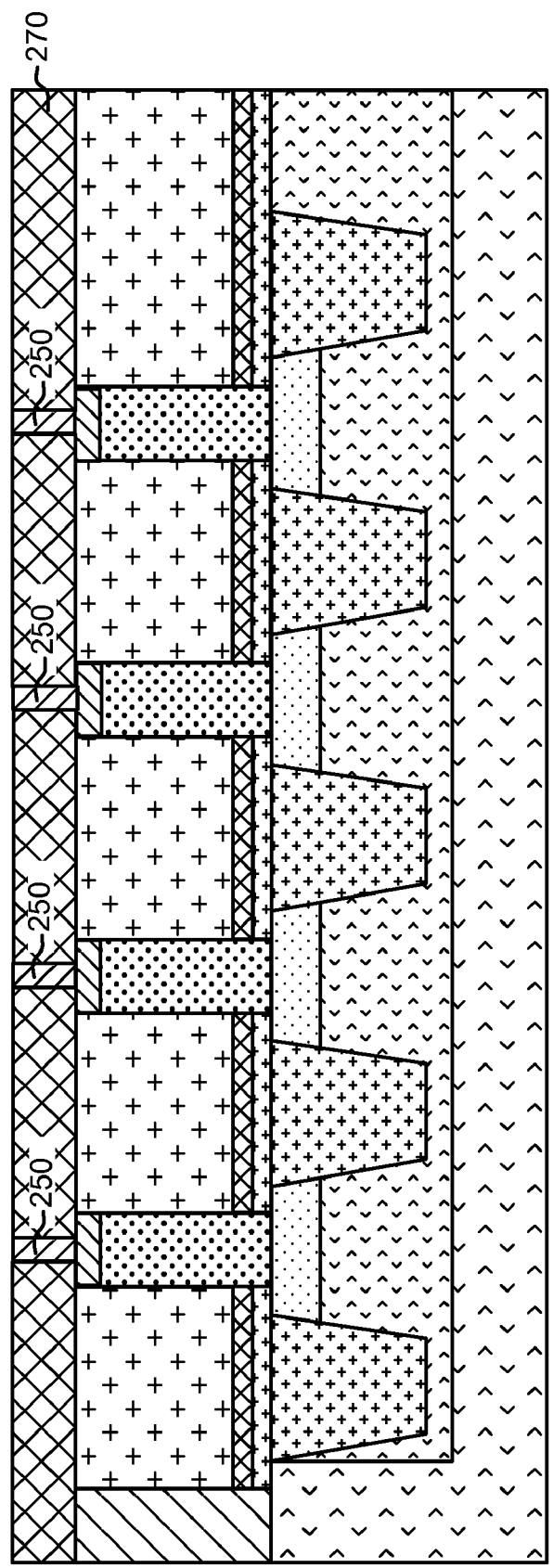
Figure 15B:
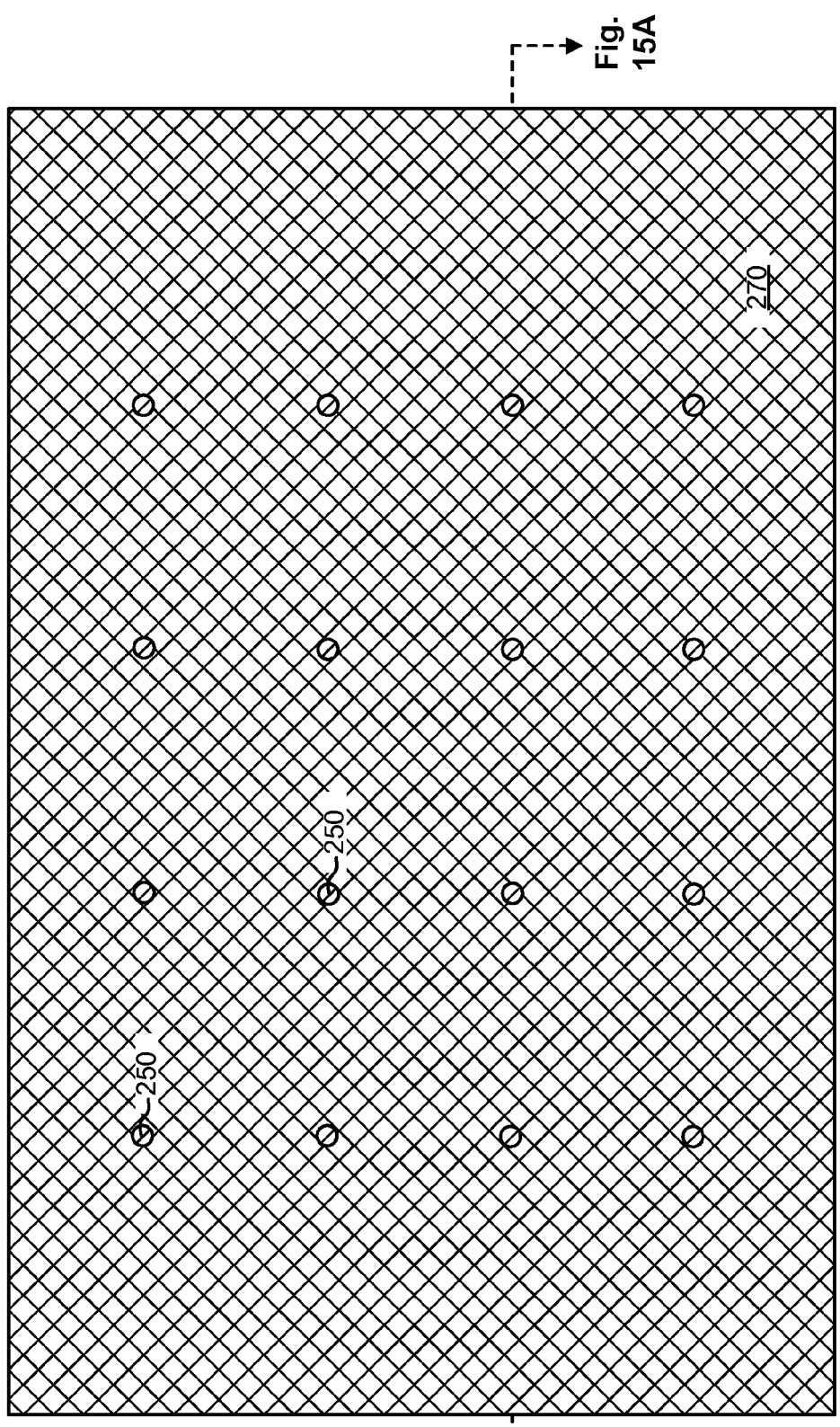

Next, bottom electrodes 250 are formed in the openings 1400 of FIGS. 14A-14B, resulting in the structure shown in the cross-sectional and top views of FIGS. 15A and 15B. In the illustrated embodiment the bottom electrodes 250 comprise TiN and are formed by chemical vapor deposition CVD of bottom electrode material on the structure illustrated in FIGS. 14A-14B followed by a planarization process such as CMP. In some alternative embodiments, for example the structures illustrated in FIGS. 4A-4B and 5A-5B, phase change material may be deposited in the openings 1400.

Figure 16A:
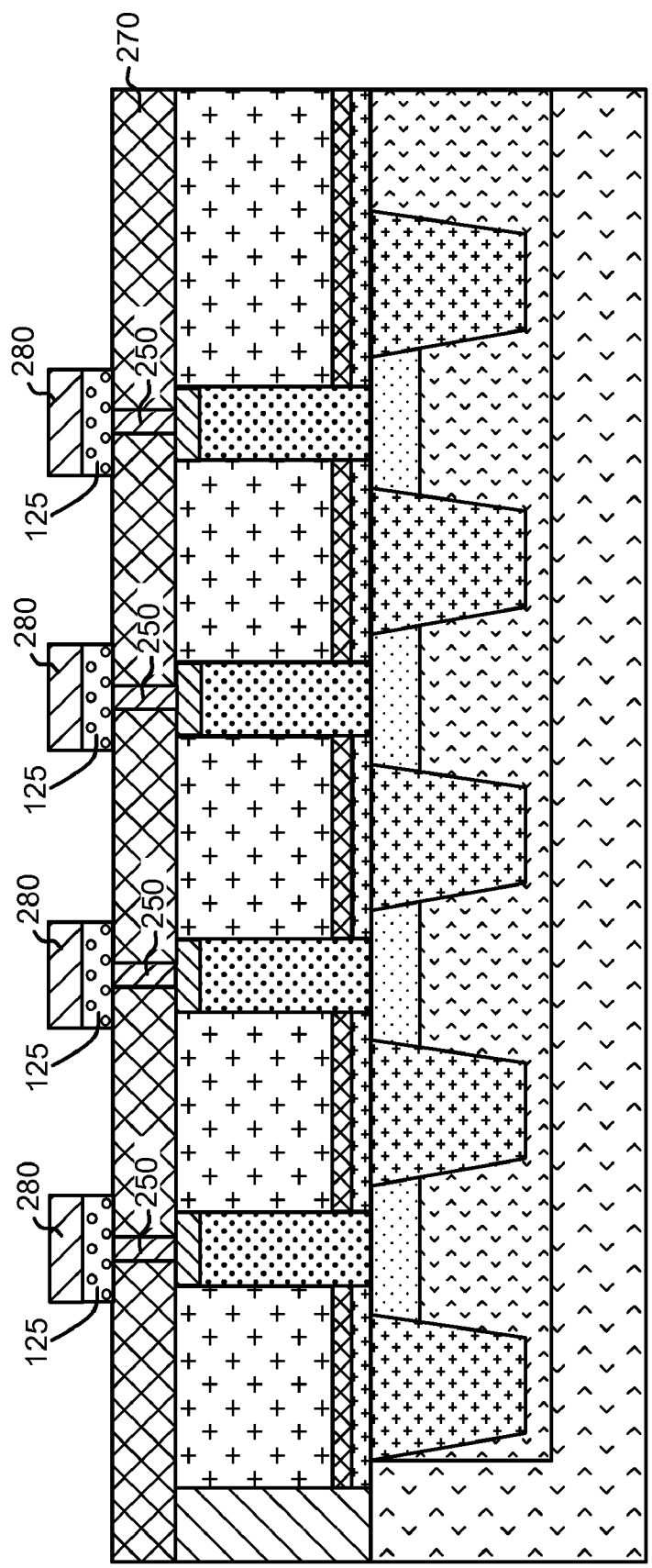
Figure 16B:
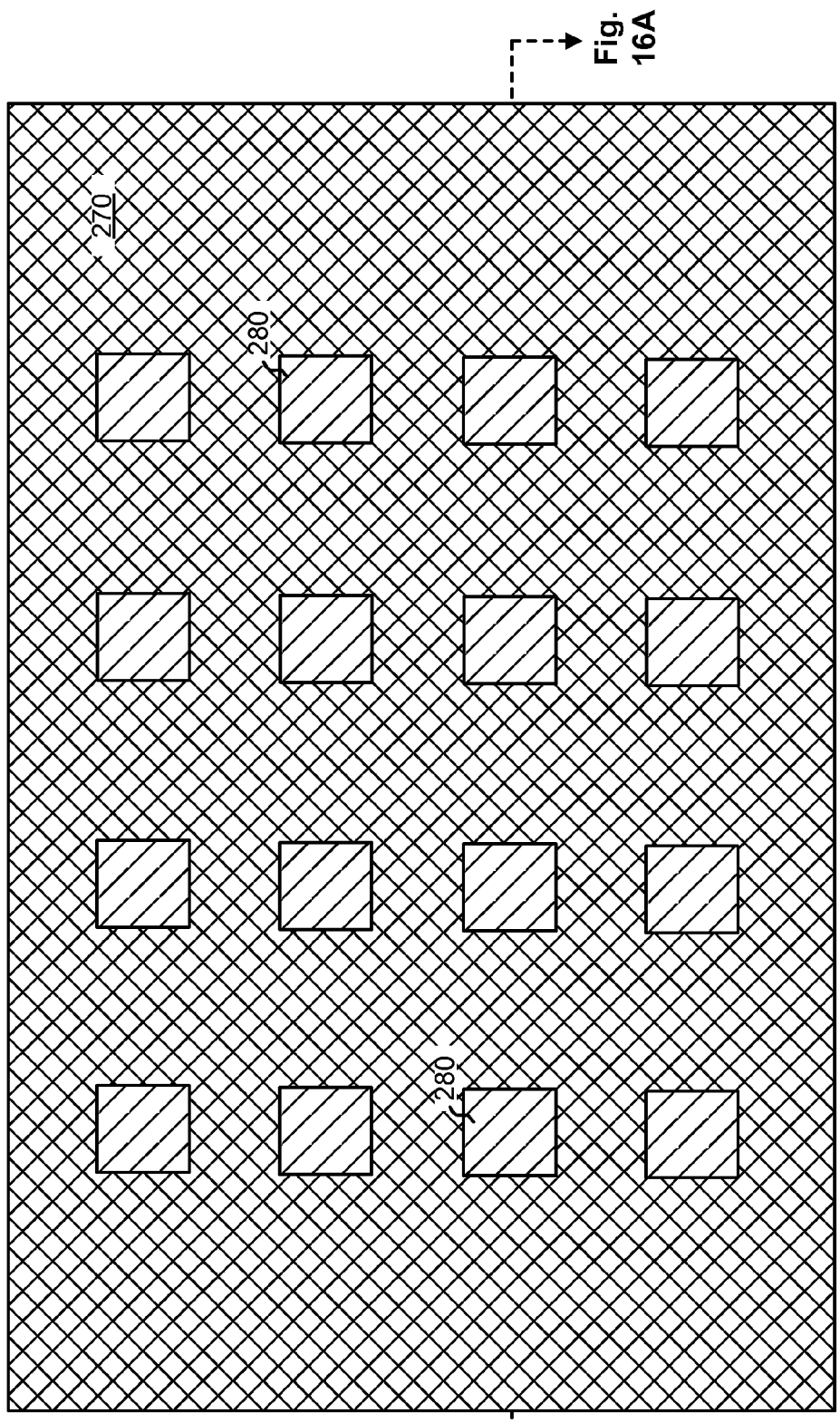

Next, memory elements 125 are formed on the bottom electrodes 250 and top electrodes 280 are formed on the memory elements 125, resulting in the structure illustrated in the cross-sectional and top views of FIGS. 16A and 16B. The memory elements 125 and top electrodes 280 may be formed by depositing a layer of memory material on the structure illustrated in FIGS. 15A-15B, depositing a layer of top electrode material on the layer of memory material, forming a layer of patterned photoresist on the layer of top electrode material, and etching the layer of memory material and the layer of top electrode material. In such an embodiment the memory element and the corresponding top electrode form a multi-layer stack.

In some alternative embodiments in which the openings 1400 of FIGS. 14A-14B are filled with memory material, the layer of memory material may be omitted.

In the illustrated embodiment the memory elements 125 and top electrodes 280 have a square-like cross-section. However, in embodiments the memory elements 125 and the top electrodes 280 may have a cross-section that that is circular, elliptical, rectangular, or somewhat irregularly shaped, depending on the manufacturing technique applied to form the memory elements 125 and top electrodes 280.

Figure 17A:
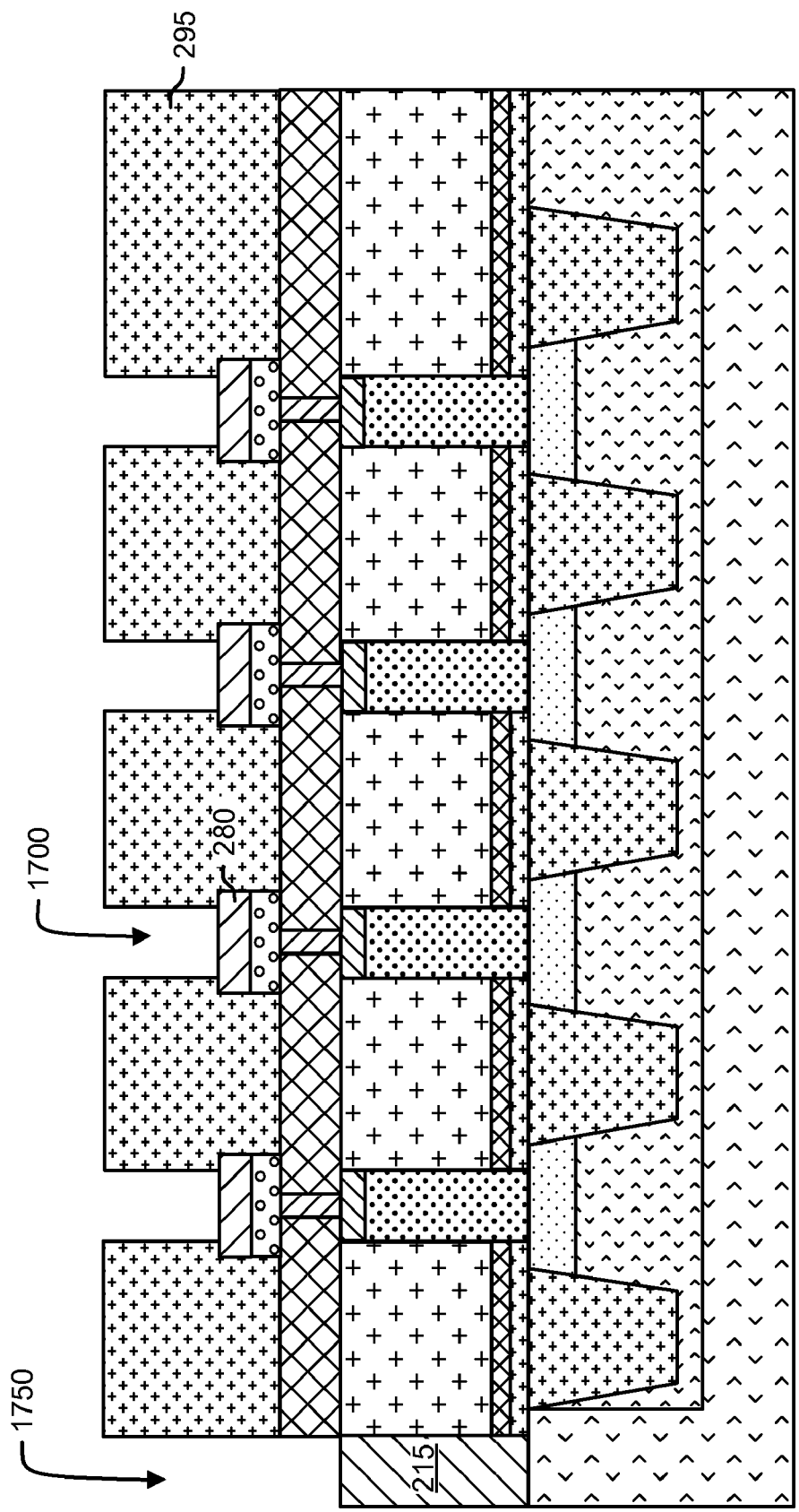
Figure 17B:
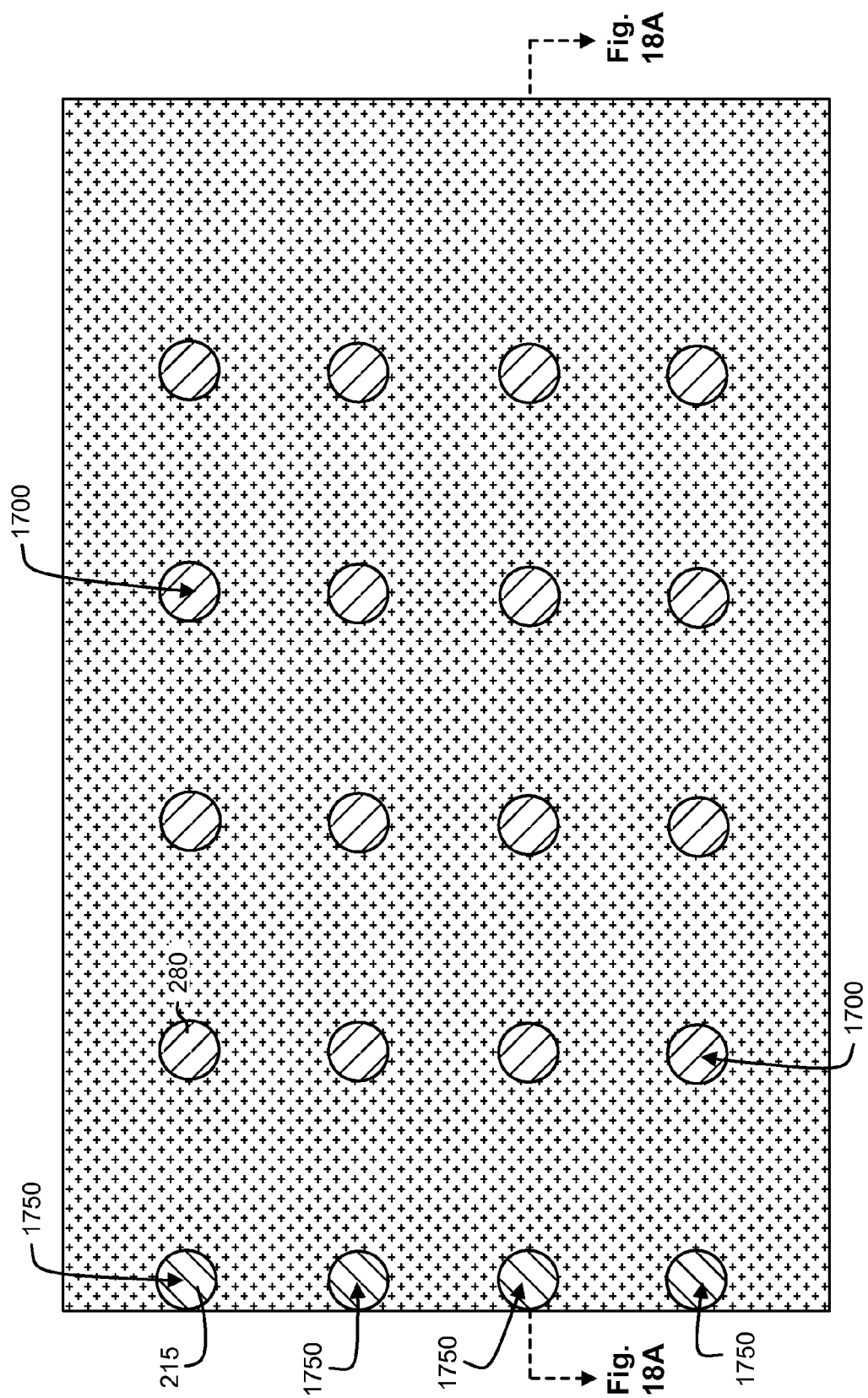

Next, dielectric 295 is formed on the structure illustrated in FIGS. 16A-16B and openings 1700 exposing top electrodes 280 and openings 1750 exposing contacts 215 are formed, resulting in the structure illustrated in the cross-sectional and top views of FIGS. 17A and 17B.

Figure 18A:
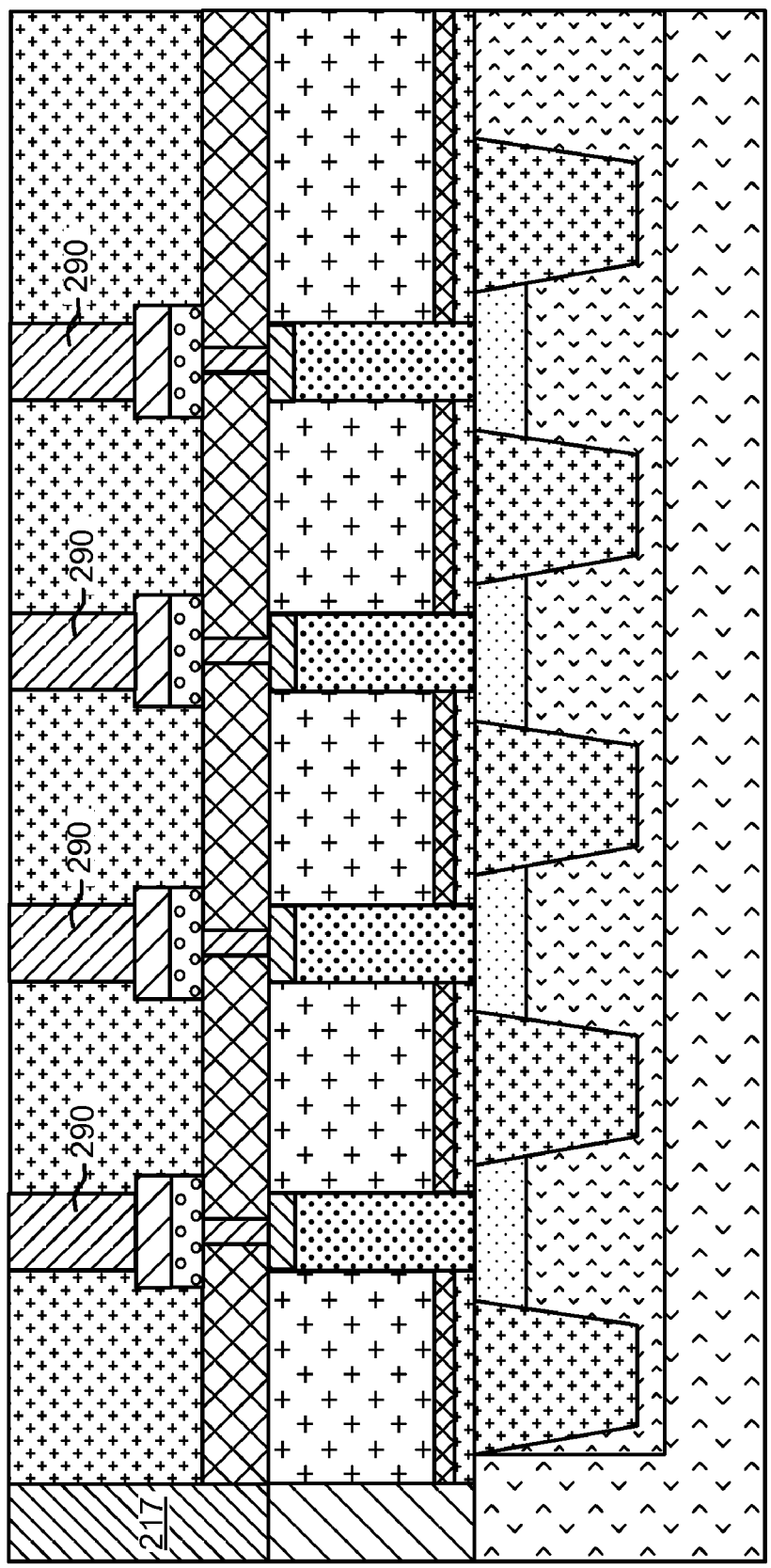
Figure 18B:
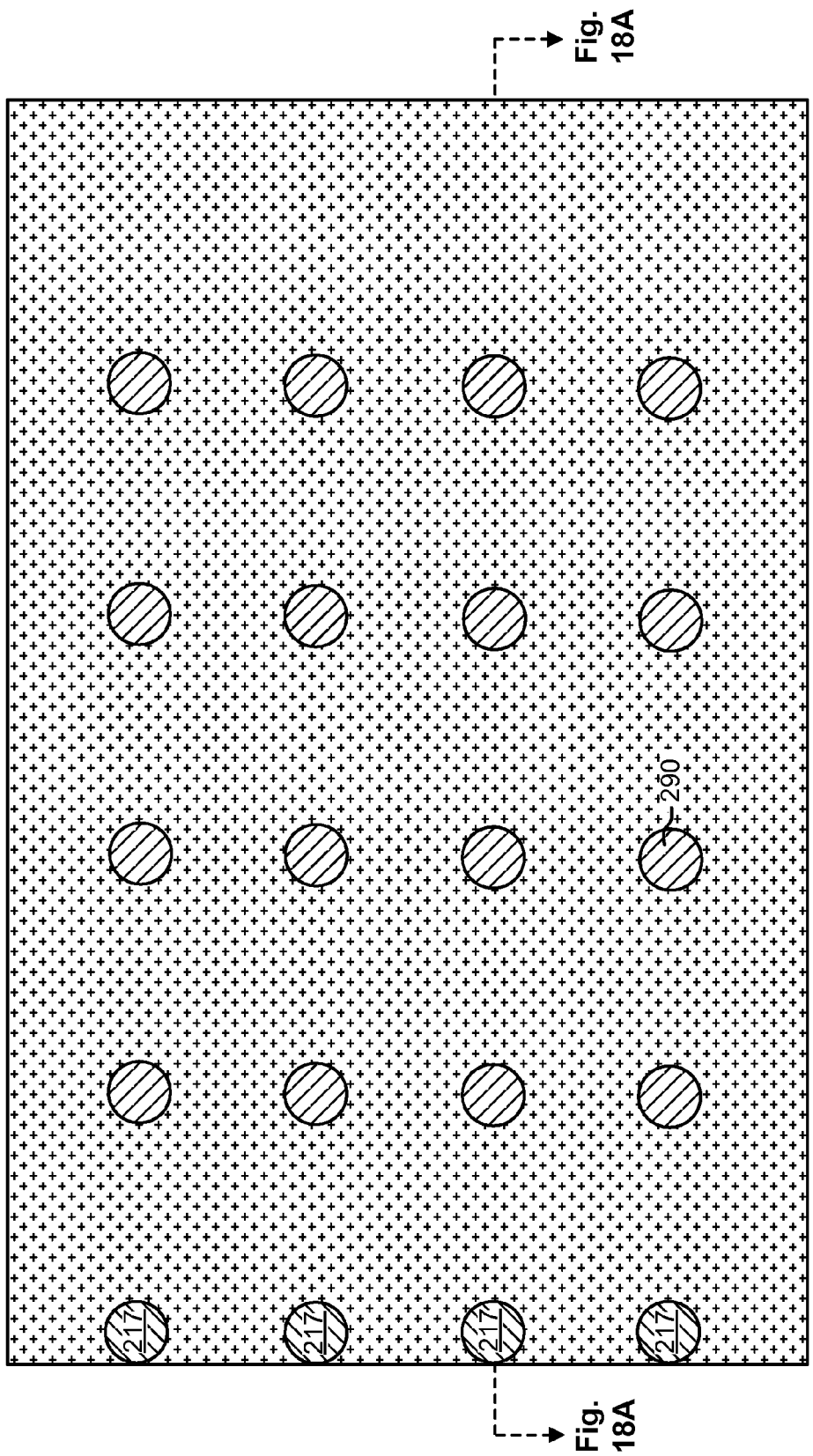

Next, conductive contacts 217 are formed within the openings 1750 and conductive contacts 290 are formed within the openings 1700 of FIGS. 17A-17B, resulting in the structure illustrated in the top and cross-sectional views of FIGS. 18A and 18B.

Figure 19A:
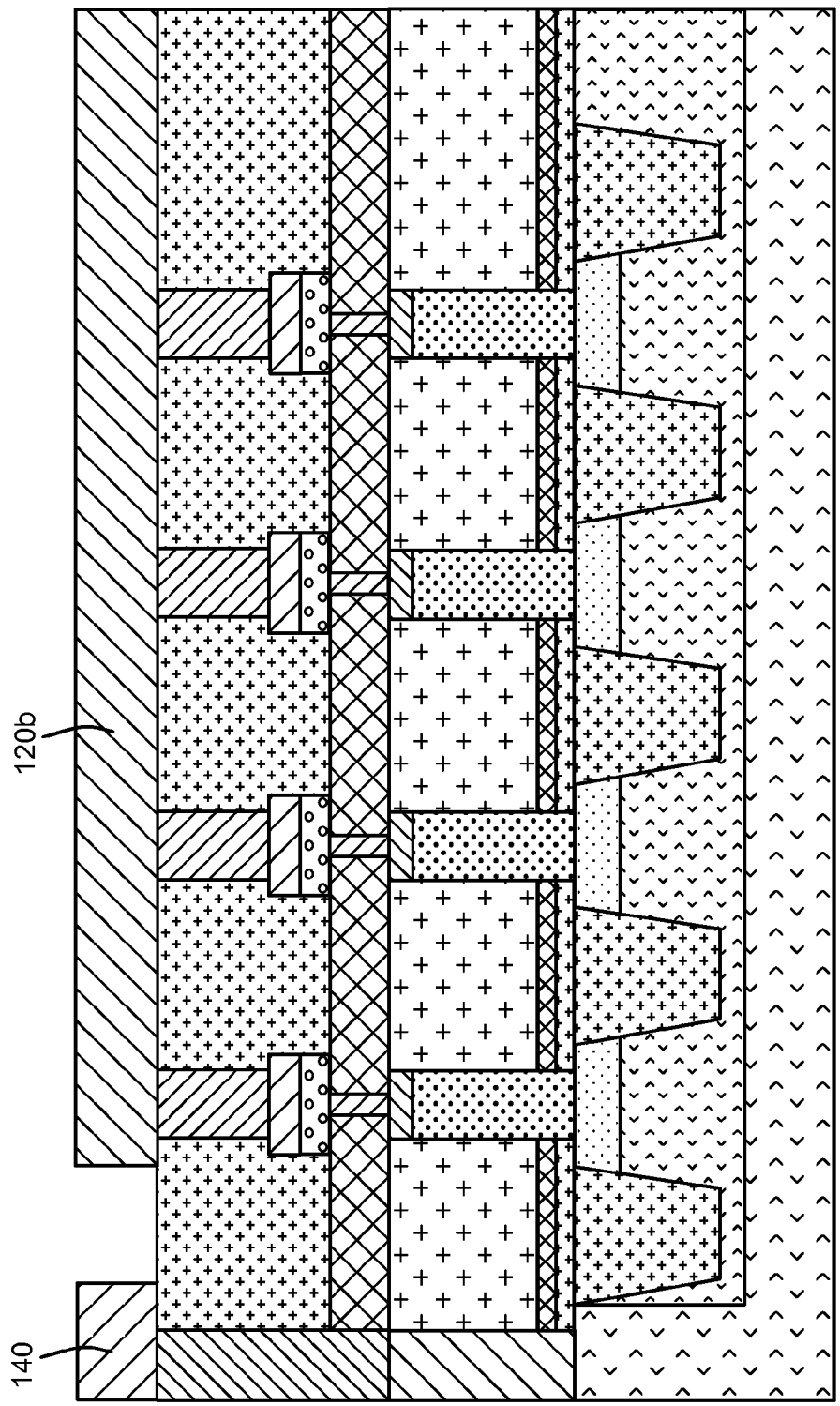
Figure 19B:
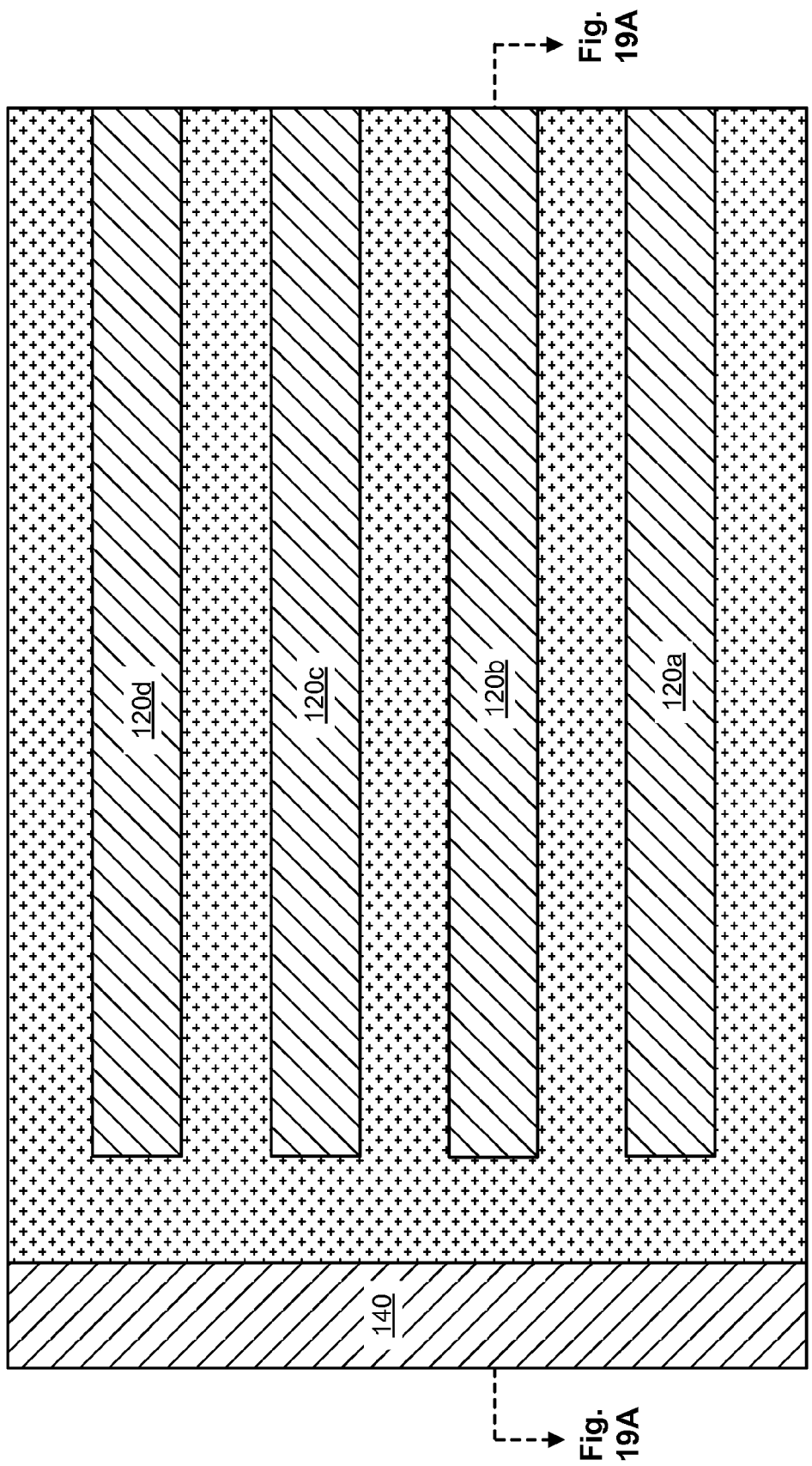

Next, conductive material 140 coupled to a reference voltage and bit lines 120 are formed on the structure illustrated in FIGS. 18A and 18B, resulting in the structure illustrated in the cross-sectional and top views of FIGS. 19A and 19B.

Figure 20A:
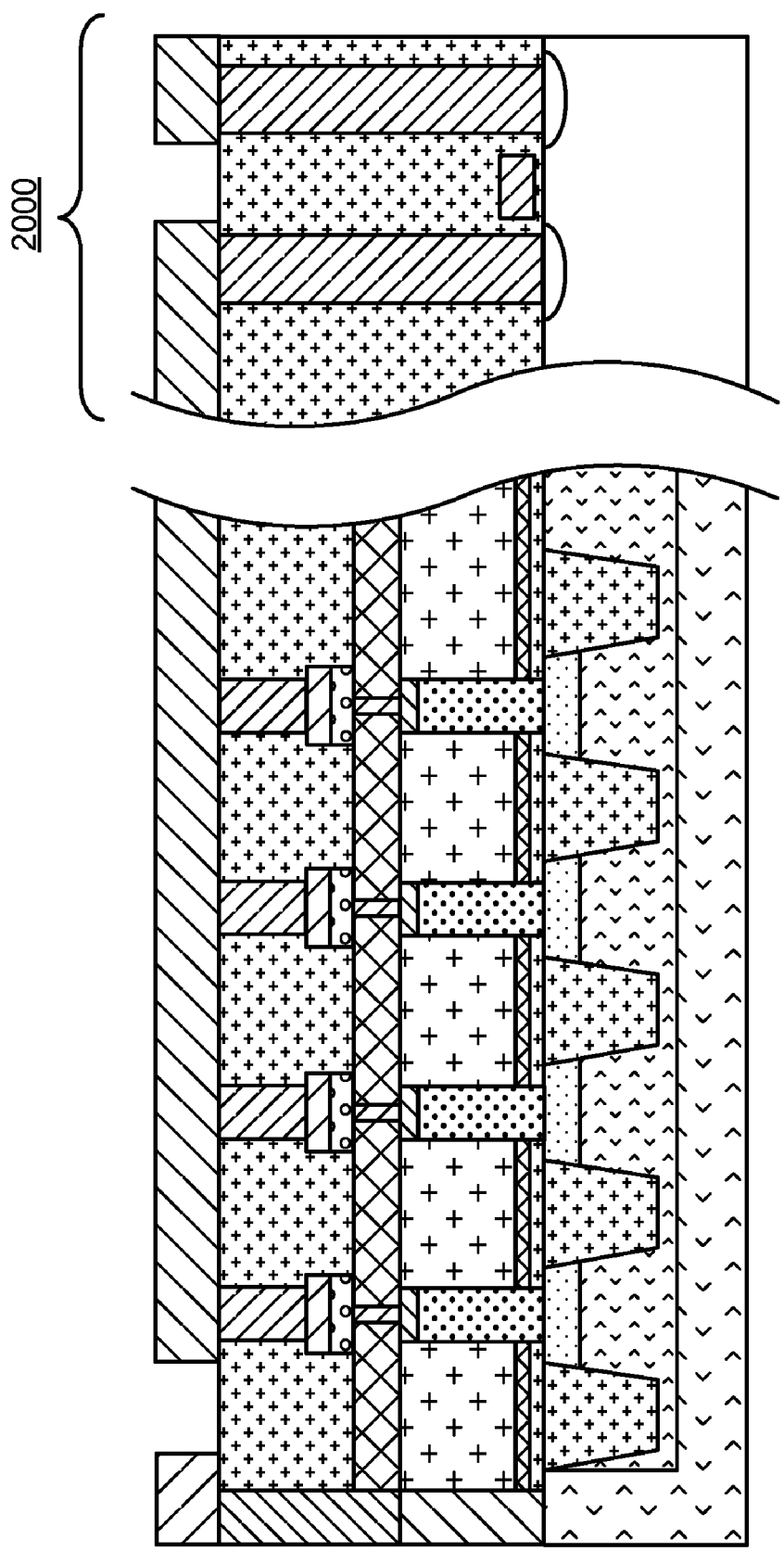
Figure 20B:
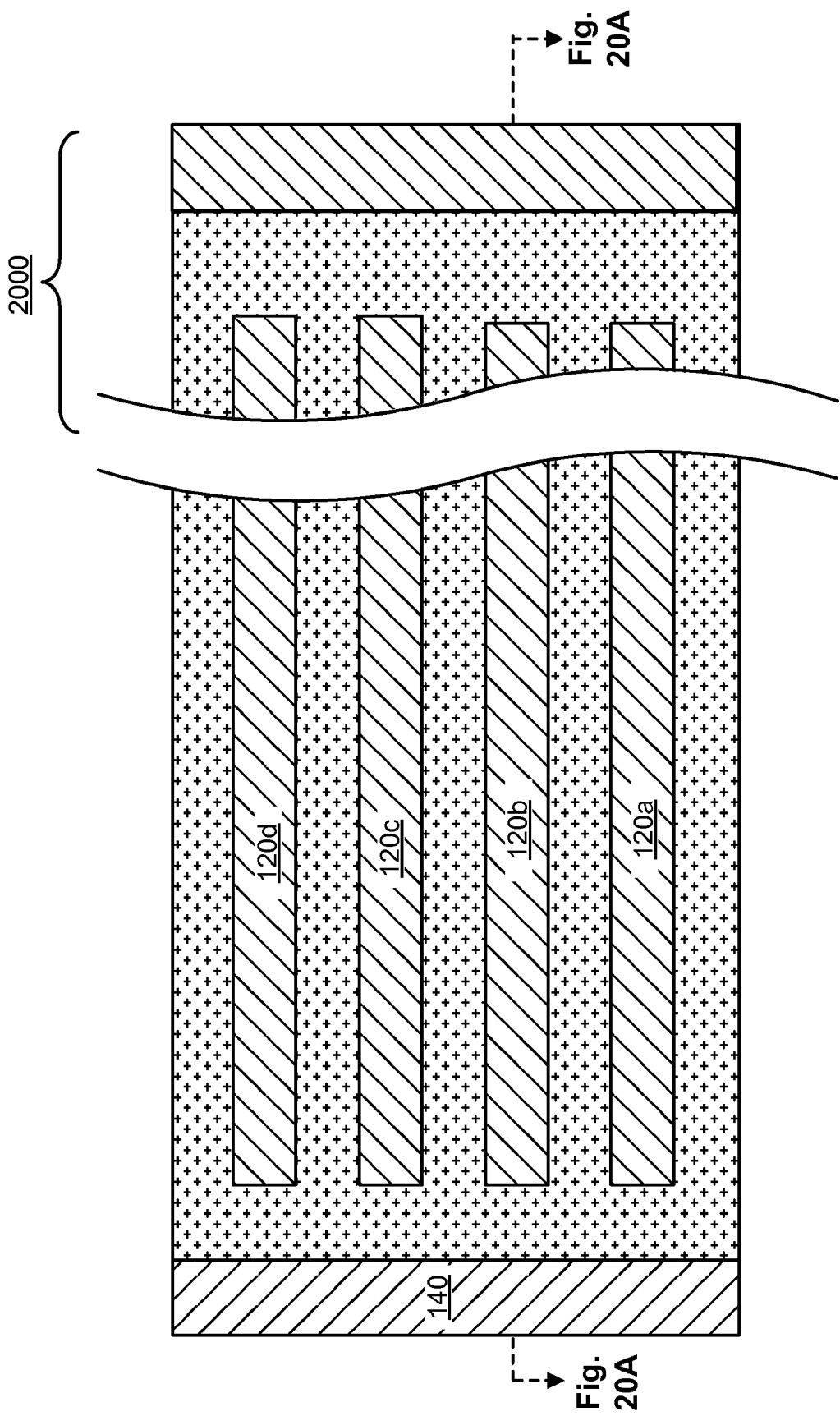

The bit lines 120 extend to peripheral circuitry 2000 including CMOS devices as shown in the top and cross-sectional views of FIGS. 20A and 20B.

FIGS. 21-24 illustrate an alternative embodiment to that illustrated in FIGS. 7A-7B for forming word lines 130a.

Figure 21A:
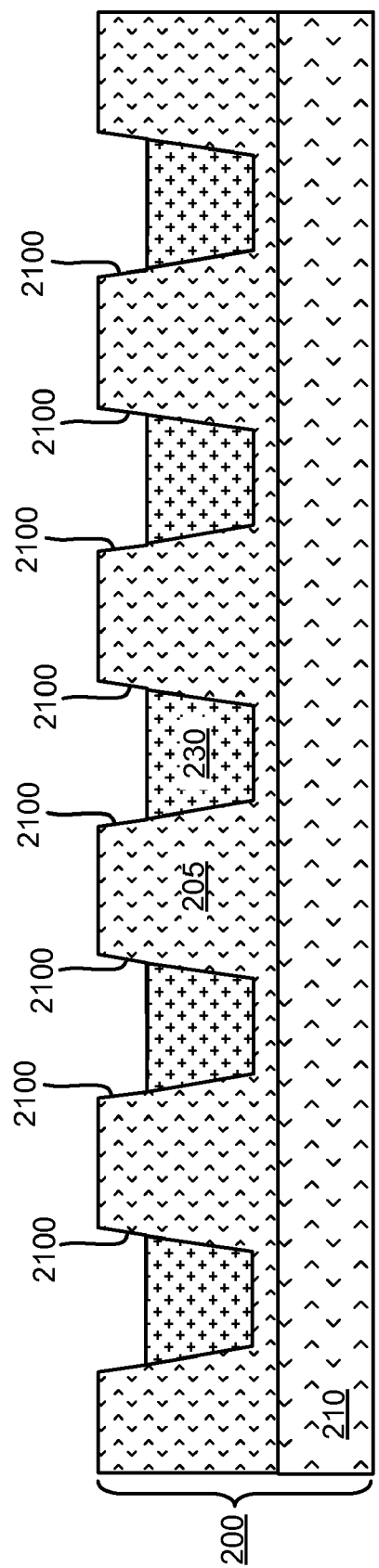
FIGS. 21-24 illustrate an alternative embodiment to that illustrated in FIGS. 7A-7B for forming word lines.
Figure 21B:
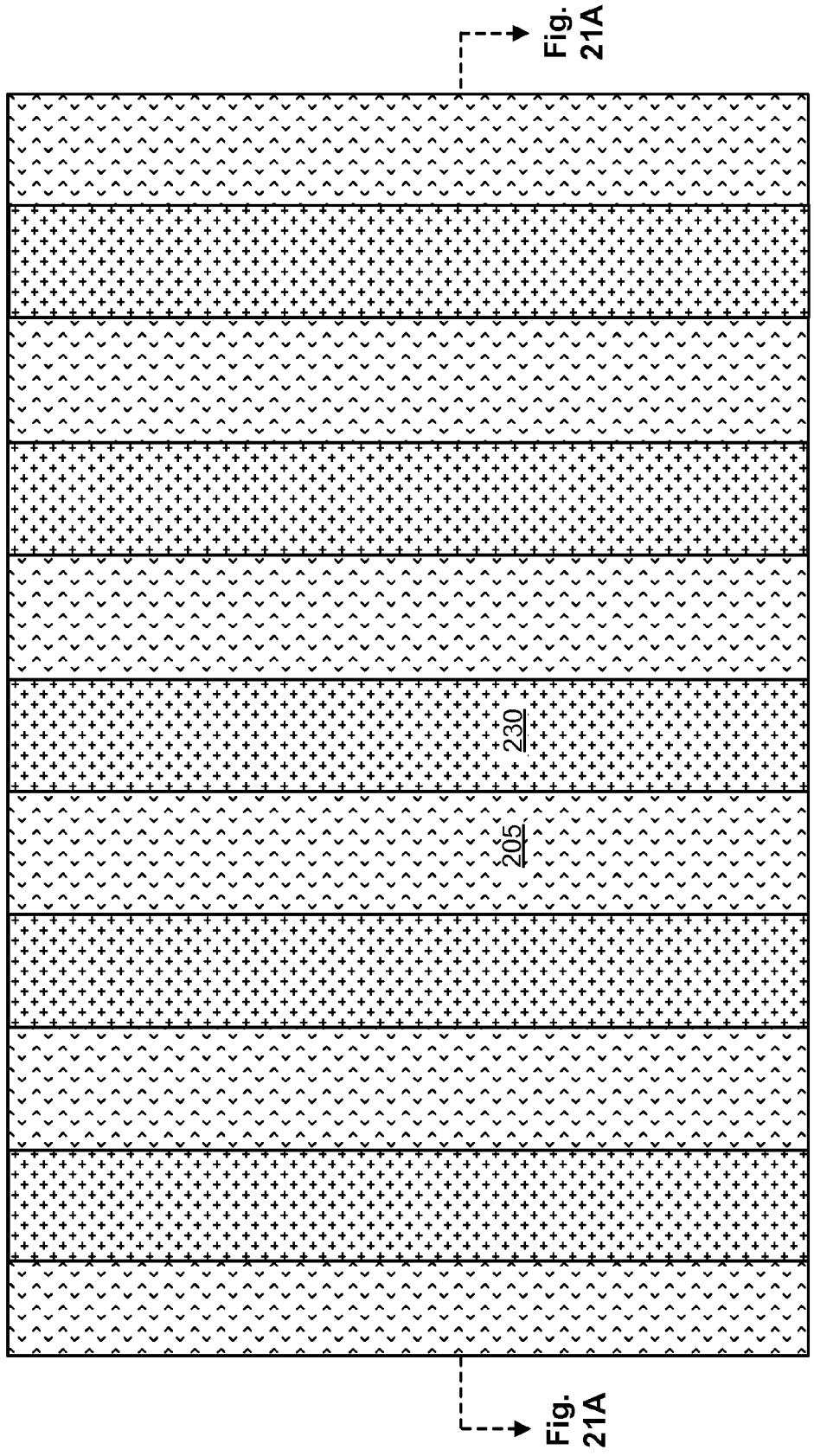

As illustrated in cross-sectional and top views of FIGS. 21A and 21B, etching is performed to remove a portion of the dielectric material of the dielectric trenches 230 of FIGS. 6A-6B, thereby exposing sidewall surfaces 2100 of first doped region 205 of the well between the dielectric trenches 230.

Figure 22A:
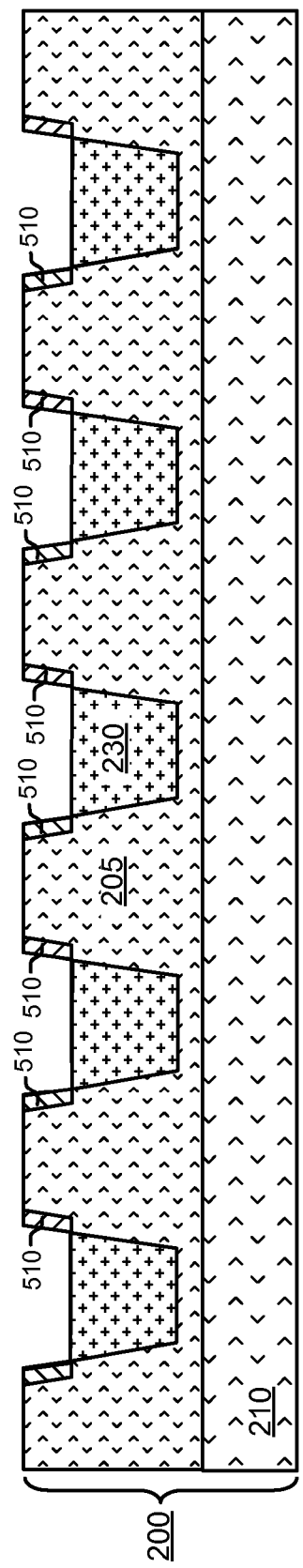
Figure 22B:
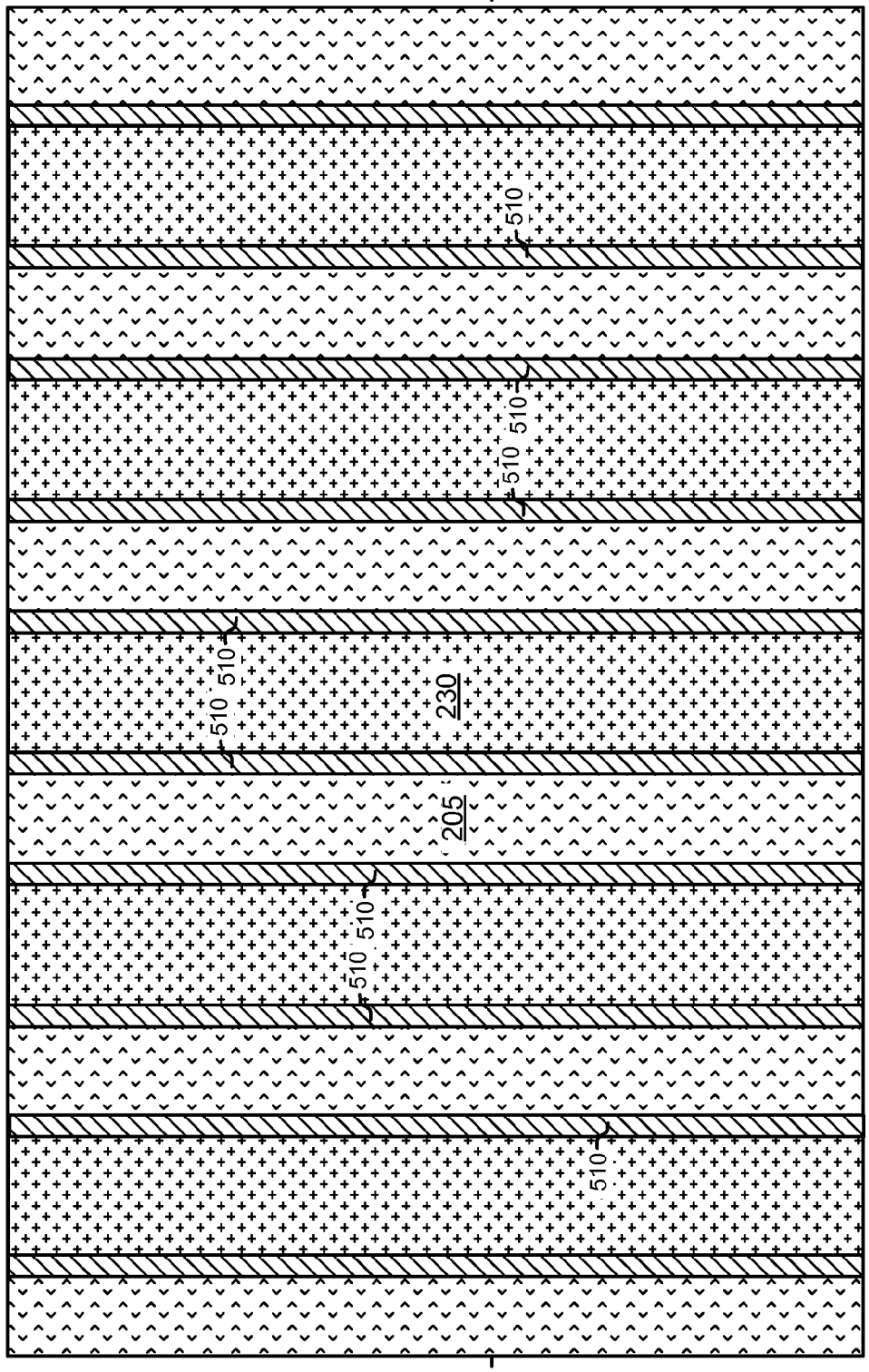

Next, sidewall conductors 510 are formed on the exposed sidewall surfaces 2100 of the first doped region 205 of the well of FIGS. 21A-21B, resulting in the structure illustrated in the cross-sectional and top views of FIGS. 22A and 22B. The sidewall conductors 510 comprise a silicide containing, for example, Ti, W, Co, Ni, or Ta. In one embodiment the sidewall conductors 510 comprise cobalt silicide (CoSi) and are formed by depositing cobalt and performing a rapid thermal process (RTP) such that the cobalt reacts with the silicon of the first doped region 205 to form the sidewall conductors 510. It is understood that other silicides may also be formed in this manner by depositing titanium, arsenic, doped nickel, or alloys thereof, in a manner similar to the example described herein using cobalt.

Figure 23A:
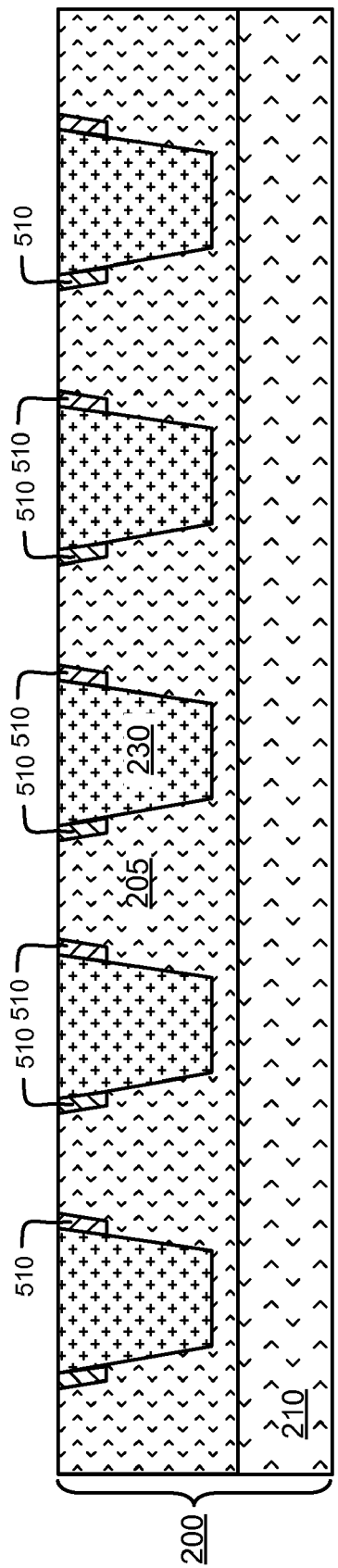
Figure 23B:
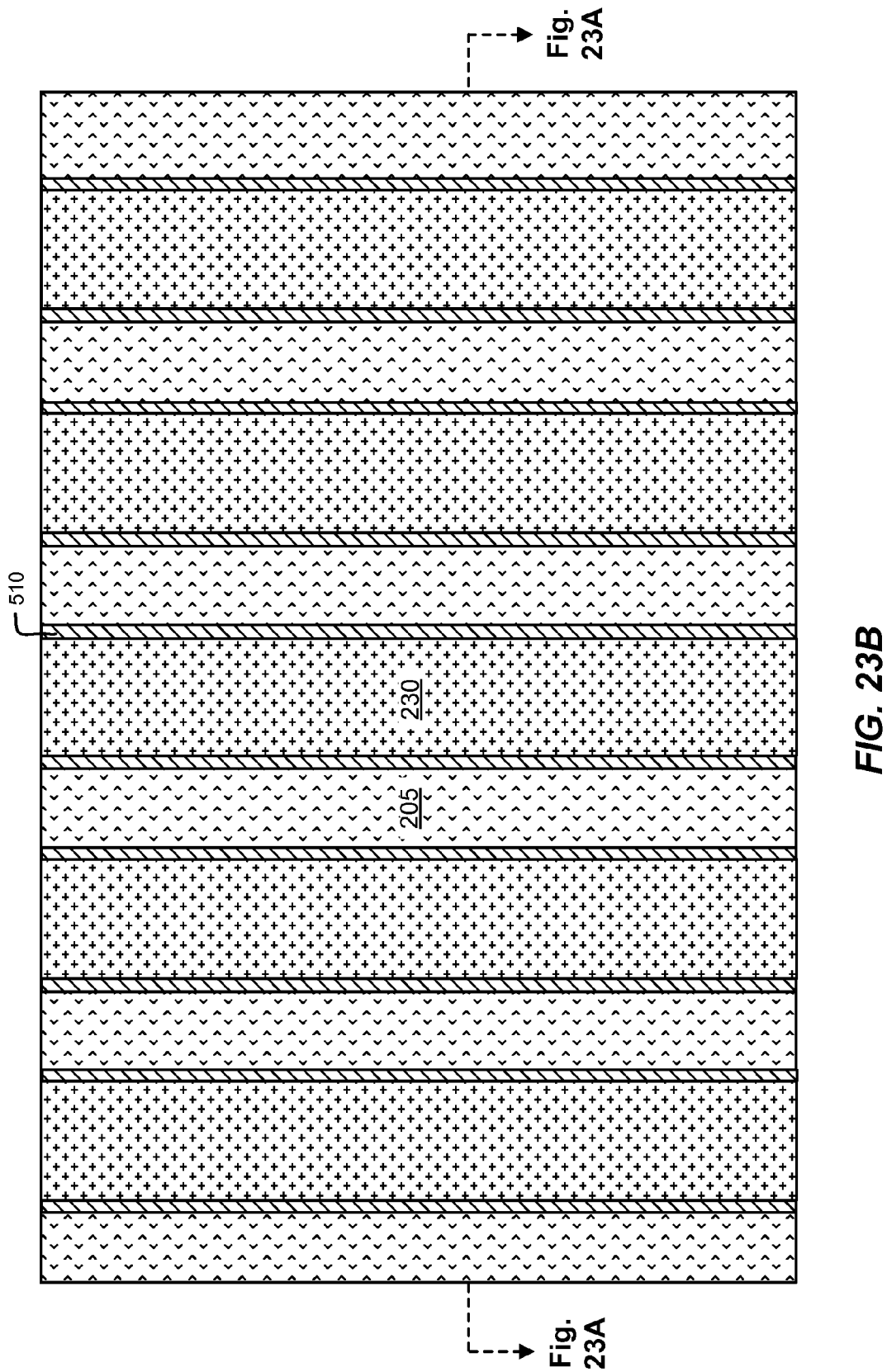

Next, dielectric material is formed on the structure illustrated in FIGS. 22A-22B to fill in the dielectric trenches 230, resulting in the structure illustrated in the cross-sectional and top views of FIGS. 23A and 23B.

Figure 24A:
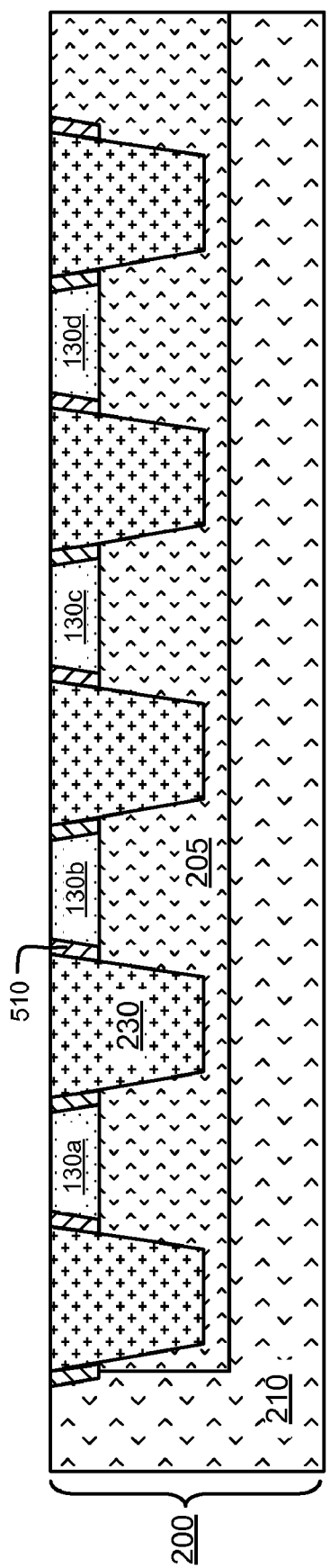
Figure 24B:
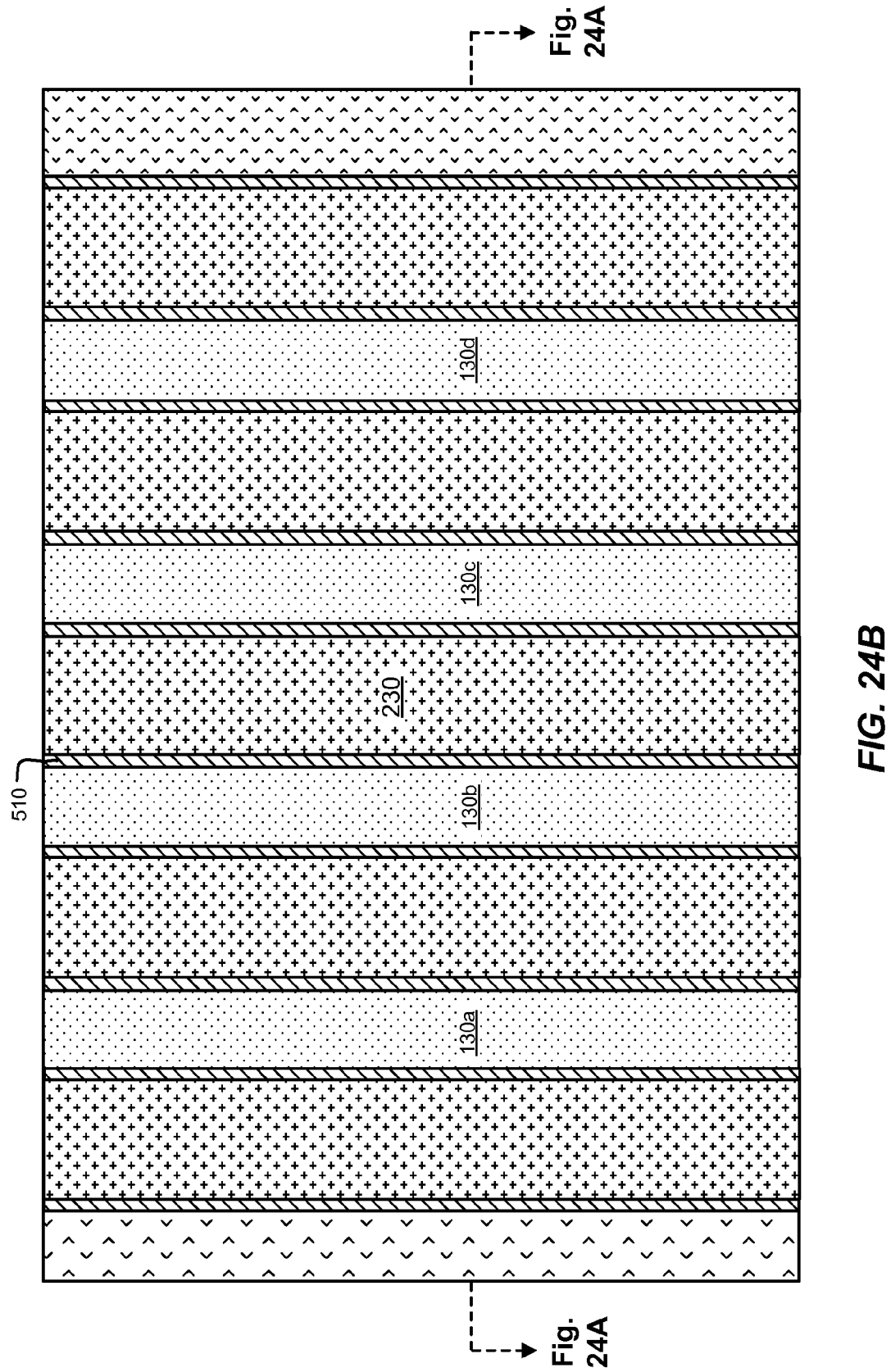

Next, ion implantation is performed to implant dopants to form word lines 130, the word lines 130 having a conductivity type different from that of the first and second doped regions 205 and 210 of the well and resulting in the structure illustrated in the cross-sectional and top views of FIGS. 24A and 24B. In the illustrated embodiment the word lines 130 comprise doped P-type material of silicon substrate 200.

Figure 25:
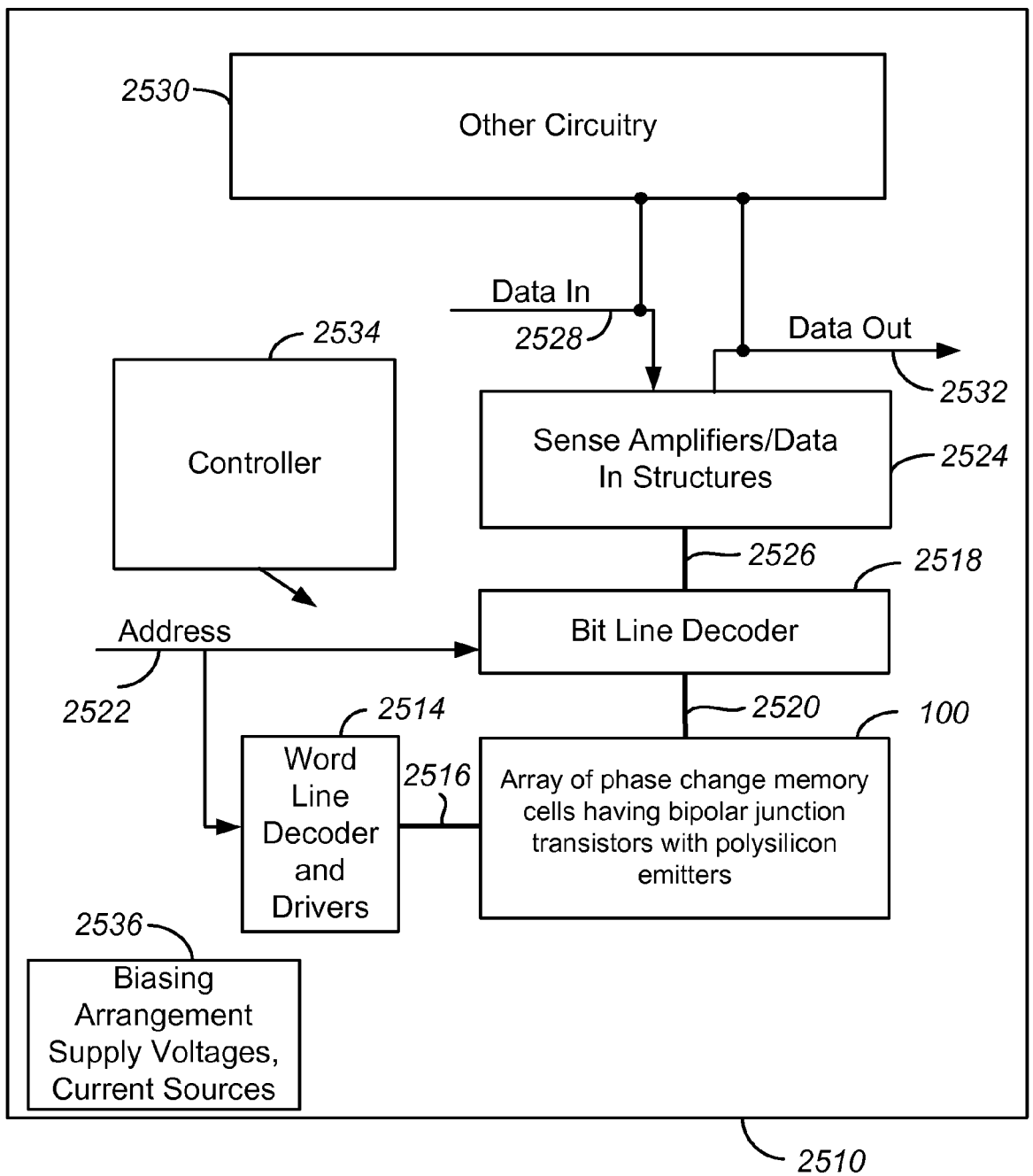
FIG. 25 is a simplified block diagram of an integrated circuit including a memory array implemented using memory cells having bipolar junction transistors with polysilicon emitters as described herein.

FIG. 25 is a simplified block diagram of an integrated circuit 2510 including a memory array 100 implemented using memory cells having bipolar junction transistors with polysilicon emitters as described herein. A word line decoder 2514 having read, set and reset modes is coupled to and in electrical communication with a plurality of word lines 2516 arranged along rows in the memory array 100. A bit line (column) decoder 2518 is in electrical communication with a plurality of bit lines 2520 arranged along columns in the array 100 for reading, setting, and resetting the phase change memory cells (not shown) in array 100. Addresses are supplied on bus 2522 to word line decoder and drivers 2514 and bit line decoder 2518. Sense amplifiers and data-in structures in block 2524, including voltage and/or current sources for the read, set, and reset modes are coupled to bit line decoder 2518 via data bus 2526. Data is supplied via a data-in line 2528 from input/output ports on integrated circuit 2510, or from other data sources internal or external to integrated circuit 2510, to data-in structures in block 2524. Other circuitry 2530 may be included on integrated circuit 2510, such as a general purpose processor or special purpose application circuitry, or a combination of modules providing system-on-a-chip functionality supported by array 100. Data is supplied via a data-out line 2532 from the sense amplifiers in block 2524 to input/output ports on integrated circuit 2510, or to other data destinations internal or external to integrated circuit 2510.

A controller 2534 implemented in this example, using a bias arrangement state machine, controls the application of bias arrangement supply voltages and current sources 2536, such as read, program, erase, erase verify and program verify voltages and/or currents. Controller 2534 may be implemented using special-purpose logic circuitry as known in the art. In alternative embodiments, controller 2534 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 2534.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A memory device comprising:
    a single-crystalline semiconductor substrate having a first conductivity type;
    a plurality of word lines within the single-crystalline semiconductor substrate and having a second conductivity type different from the first conductivity type;
    a plurality of memory cells, memory cells in the plurality of memory cells comprising respective bipolar junction transistors and memory elements, the bipolar junction transistors coupled in a common collector configuration and including:
        an emitter comprising doped polysilicon having the first conductivity type, the emitter contacting a corresponding word line in the plurality of word lines to define a pn junction;
        a portion of the corresponding word line underlying the emitter acting as a base of the bipolar junction transistor; and
        a collector comprising a portion of the single-crystalline substrate underlying the base.

2. The device of claim 1, wherein the single-crystalline substrate comprises a first doped region on a second doped region, the second doped region more highly doped than the first doped region.

3. The device of claim 1, further comprising conductive contacts contacting the single-crystalline substrate and coupled to a reference voltage.

4. The device of claim 1, further comprising sidewall conductors comprising silicide on sidewall surfaces of the word lines.

5. The device of claim 1, wherein:
    the single-crystalline semiconductor substrate comprises n-type doped semiconductor material;
    the word lines comprise p-type doped semiconductor material; and
    the emitter of each memory cell comprises n-type doped polysilicon.

6. The device of claim 1, wherein:
    the single-crystalline semiconductor substrate comprises p-type doped semiconductor material;
    the word lines comprise n-type doped semiconductor material; and
    the emitter of each memory cell comprises p-type doped polysilicon.

7. The device of claim 1, wherein memory cells in the plurality of memory cells further comprise:
    a conductive cap comprising silicide on the corresponding bipolar junction transistor;
    a bottom electrode between the conductive cap and the memory element, the bottom electrode having a width less than that of the memory element; and
    a top electrode on the memory element.

8. The device of claim 1, wherein memory cells in the plurality of memory cells further comprise:
    a conductive cap comprising silicide on the corresponding bipolar junction transistor; and
    a top electrode, the memory element electrically coupling the conductive cap to the top electrode.

9. The device of claim 8, wherein the memory elements of the memory cells comprises a pillar of memory material surrounded by a dielectric and having a width less than that of the conductive cap and the top electrode.

10. The device of claim 8, wherein the memory elements of the memory cells comprise:
    a first portion on the conductive cap and surrounded by a dielectric; and
    a second portion on the first portion, wherein the first portion has a width less than that of the second portion, the conductive cap, and the top electrode.

11. A method for manufacturing a memory device, the method comprising:
    forming a single-crystalline semiconductor substrate having a first conductivity type;
    forming a plurality of word lines within the single-crystalline semiconductor substrate and having a second conductivity type different from the first conductivity type;
    forming a plurality of memory cells, forming memory cells in the plurality of memory cells comprising forming respective bipolar junction transistors and memory elements, the bipolar junction transistors coupled in a common collector configuration and including:
        an emitter comprising doped polysilicon having the first conductivity type, the emitter contacting a corresponding word line in the plurality of word lines to define a pn junction;
        a portion of the corresponding word line underlying the emitter acting as a base of the bipolar junction transistor; and
        a collector comprising a portion of the single-crystalline substrate underlying the base.

12. The method of claim 11, wherein the single-crystalline semiconductor substrate comprises a first doped region on a second doped region, the second doped region more highly doped than the first doped region.

13. The method of claim 11, further comprising forming conductive contacts contacting the single-crystalline substrate and coupled to a reference voltage.

14. The method of claim 11, further comprising forming sidewall conductors comprising silicide on sidewall surfaces of the word lines.

15. The method of claim 11, wherein:
    the single-crystalline semiconductor substrate comprises n-type doped semiconductor material;
    the word lines comprise p-type doped semiconductor material; and
    the emitter of each memory cell comprises n-type doped polysilicon.

16. The method of claim 11, wherein:
the single-crystalline semiconductor substrate comprises p-type doped semiconductor material;
the word lines comprise n-type doped semiconductor material; and
the emitter of each memory cell comprises p-type doped polysilicon.

17. The method of claim 11, wherein forming memory cells in the plurality of memory cells further comprises:
forming a conductive cap comprising silicide on the corresponding bipolar junction transistor;
forming a bottom electrode between the conductive cap and the memory element, the bottom electrode having a width less than that of the memory element; and
forming a top electrode on the memory element.

18. The method of claim 11, wherein forming memory cells in the plurality of memory cells further comprises:
forming a conductive cap comprising silicide on the corresponding bipolar junction transistor; and
forming a top electrode, the memory element electrically coupling the conductive cap to the top electrode.

19. The method of claim 18, wherein the memory elements of the memory cells comprise a pillar of memory material surrounded by a dielectric and having a width less than that of the conductive cap and the top electrode.

20. The method of claim 18, wherein the memory element of each memory cell comprises:
a first portion on the conductive cap and surrounded by a dielectric; and
a second portion on the first portion, wherein the first portion of the memory element has a width less than that of the second portion, the conductive cap, and the top electrode.

* * * * *